(12) United States Patent
Tsuchiya et al.

(10) Patent No.: US 10,367,124 B2
(45) Date of Patent: Jul. 30, 2019

(54) DISPLAY DEVICE AND METHOD FOR MANUFACTURING THE SAME

(71) Applicant: Semiconductor Energy Laboratory Co., Ltd., Kanagawa-ken (JP)

(72) Inventors: Kaoru Tsuchiya, Kanagawa (JP); Aya Anzai, Kanagawa (JP); Masayuki Sakakura, Kanagawa (JP); Masaharu Nagai, Kanagawa (JP); Yutaka Matsuda, Tochigi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 15/919,780

(22) Filed: Mar. 13, 2018

(65) Prior Publication Data

US 2018/0204988 A1 Jul. 19, 2018

Related U.S. Application Data

(60) Continuation of application No. 14/274,143, filed on May 9, 2014, now Pat. No. 9,923,127, which is a
(Continued)

(30) Foreign Application Priority Data

Aug. 29, 2003 (JP) .................................. 2003-347601
Sep. 12, 2003 (JP) .................................. 2003-322334

(51) Int. Cl.
*H01L 33/52* (2010.01)
*H01L 27/32* (2006.01)
*H01L 51/52* (2006.01)

(52) U.S. Cl.
CPC .......... *H01L 33/52* (2013.01); *H01L 27/3244* (2013.01); *H01L 27/3276* (2013.01);
(Continued)

(58) Field of Classification Search
CPC ........................ H01L 33/52; H01L 51/5246
(Continued)

(56) References Cited

U.S. PATENT DOCUMENTS 5,882,761 A 3/1999 Kawami et al.
6,030,715 A 2/2000 Thompson et al.
(Continued)

FOREIGN PATENT DOCUMENTS

CN 001383852 A 12/2002
CN 001419297 A 5/2003
(Continued)

OTHER PUBLICATIONS

Miyashita, S. et al, "Full Color Displays Fabricated by Ink-Jet Printing," Asia Display/IDW '01, 2001, pp. 1399-1402.
(Continued)

*Primary Examiner* — Christopher M Raabe
(74) *Attorney, Agent, or Firm* — Husch Blackwell LLP

(57) ABSTRACT

An object of the present invention is to provide such a sealing structure that a material to be a deterioration factor such as water or oxygen is prevented from entering from external and sufficient reliability is obtained in a display using an organic or inorganic electroluminescent element. In view of the above object, focusing on permeability of an interlayer insulating film, deterioration of an electroluminescent element is suppressed and sufficient reliability is obtained by preventing water entry from an interlayer insulating film according to the present invention.

13 Claims, 22 Drawing Sheets

Related U.S. Application Data continuation of application No. 13/088,578, filed on Apr. 18, 2011, now Pat. No. 8,723,417, which is a division of application No. 10/919,605, filed on Aug. 17, 2004, now Pat. No. 7,928,654.

(52) U.S. Cl.
CPC .. *H01L 51/5246* (2013.01); *H01L 2251/5323* (2013.01); *H01L 2924/0002* (2013.01)

(58) Field of Classification Search
USPC .................................................. 313/498–512
See application file for complete search history.

(56) References Cited

U.S. PATENT DOCUMENTS

| | | | |
|---|---|---|---|
| 6,136,624 A | 10/2000 | Kemmochi et al. | |
| 6,150,043 A | 11/2000 | Thompson et al. | |
| 6,252,297 B1 | 6/2001 | Kemmochi et al. | |
| 6,303,238 B1 | 10/2001 | Thompson et al. | |
| 6,333,521 B1 | 12/2001 | Thompson et al. | |
| 6,387,544 B1 | 5/2002 | Thompson et al. | |
| 6,413,656 B1 | 7/2002 | Thompson et al. | |
| 6,420,031 B1 | 7/2002 | Parthasarathy et al. | |
| 6,424,401 B1 | 7/2002 | Kang et al. | |
| 6,451,455 B1 | 9/2002 | Thompson et al. | |
| 6,469,437 B1 | 10/2002 | Parthasarathy et al. | |
| 6,579,632 B2 | 6/2003 | Thompson et al. | |
| 6,633,121 B2 | 10/2003 | Eida et al. | |
| 6,798,132 B2 | 9/2004 | Satake | |
| 6,822,264 B2 | 11/2004 | Yamazaki et al. | |
| 6,833,560 B2 | 12/2004 | Konuma et al. | |
| 6,861,710 B2 | 3/2005 | Murakami et al. | |
| 6,864,508 B2 | 3/2005 | Yamazaki et al. | |
| 6,872,477 B2 | 3/2005 | Thompson et al. | |
| 6,903,377 B2 | 6/2005 | Yamazaki et al. | |
| 6,903,731 B2 | 6/2005 | Inukai | |
| 7,019,718 B2 | 3/2006 | Yamazaki et al. | |
| 7,033,848 B2 | 4/2006 | Murakami et al. | |
| 7,042,024 B2 | 5/2006 | Yamazaki et al. | |
| 7,112,115 B1 | 9/2006 | Yamazaki et al. | |
| 7,129,523 B2 | 10/2006 | Yamazaki et al. | |
| 7,132,693 B2 | 11/2006 | Konuma et al. | |
| 7,279,235 B2 | 10/2007 | Thompson et al. | |
| 7,279,237 B2 | 10/2007 | Thompson et al. | |
| 7,288,420 B1 | 10/2007 | Yamazaki et al. | |
| 7,298,694 B2* | 11/2007 | Kamiya | H04J 3/1617 370/218 |
| 7,393,707 B2 | 7/2008 | Yamazaki et al. | |
| 7,405,515 B2 | 7/2008 | Satake | |
| 7,432,529 B2 | 10/2008 | Yamazaki et al. | |
| 7,442,963 B2 | 10/2008 | Yamazaki et al. | |
| 7,462,501 B2 | 12/2008 | Yamazaki et al. | |
| 7,486,368 B2 | 2/2009 | Sakakura et al. | |
| 7,488,542 B2 | 2/2009 | Thompson et al. | |
| 7,492,012 B2 | 2/2009 | Murakami et al. | |
| 7,563,519 B2 | 7/2009 | Thompson et al. | |
| 7,619,258 B2 | 11/2009 | Tsuchiya et al. | |
| 7,629,617 B2 | 12/2009 | Yamazaki et al. | |
| 7,709,846 B2 | 5/2010 | Yamazaki et al. | |
| 7,732,824 B2 | 6/2010 | Konuma et al. | |
| 7,901,795 B2 | 3/2011 | Thompson et al. | |
| 7,939,835 B2 | 5/2011 | Yamazaki et al. | |
| 8,158,992 B2 | 4/2012 | Konuma et al. | |
| 8,174,029 B2 | 5/2012 | Yamazaki et al. | |
| 8,723,417 B2* | 5/2014 | Tsuchiya | H01L 27/3244 313/512 |
| 9,508,940 B2 | 11/2016 | Thompson et al. | |
| 9,923,127 B2* | 3/2018 | Tsuchiya | H01L 27/3244 |
| 2001/0017684 A1 | 8/2001 | Hirakata et al. | |
| 2002/0011975 A1 | 1/2002 | Yamazaki et al. | |
| 2002/0025591 A1 | 2/2002 | Ohnuma et al. | |
| 2002/0090007 A1 | 7/2002 | Kamiya et al. | |
| 2002/0113248 A1 | 8/2002 | Yamagata et al. | |
| 2002/0158568 A1 | 10/2002 | Satake | |
| 2002/0176992 A1 | 11/2002 | Parthasarathy et al. | |
| 2002/0180371 A1 | 12/2002 | Yamazaki et al. | |
| 2003/0008991 A1 | 1/2003 | Holmes et al. | |
| 2003/0080338 A1 | 5/2003 | Yamazaki et al. | |
| 2003/0089991 A1 | 5/2003 | Yamazaki et al. | |
| 2003/0094615 A1 | 5/2003 | Yamazaki et al. | |
| 2003/0127651 A1 | 7/2003 | Murakami et al. | |
| 2003/0227255 A1 | 12/2003 | Auch et al. | |
| 2004/0075094 A1 | 4/2004 | Yamazaki et al. | |
| 2004/0125315 A1 | 7/2004 | Park et al. | |
| 2004/0150776 A1 | 8/2004 | Kim | |
| 2004/0185301 A1 | 9/2004 | Tsuchiya et al. | |
| 2004/0232418 A1 | 11/2004 | Koyama et al. | |
| 2004/0263740 A1* | 12/2004 | Sakakura | H01L 51/5237 349/138 |
| 2005/0045891 A1 | 3/2005 | Yamazaki et al. | |
| 2005/0046346 A1 | 3/2005 | Tsuchiya et al. | |
| 2005/0156519 A1 | 7/2005 | Yoshizawa et al. | |
| 2005/0206313 A1 | 9/2005 | Yamazaki et al. | |
| 2005/0214570 A1 | 9/2005 | Thompson et al. | |
| 2005/0218396 A1 | 10/2005 | Tsuchiya et al. | |
| 2006/0006424 A1 | 1/2006 | Yamazaki et al. | |
| 2006/0151789 A1 | 7/2006 | Murakami et al. | |
| 2009/0026946 A1 | 1/2009 | Satake | |
| 2009/0256467 A1 | 10/2009 | Yamazaki et al. | |
| 2015/0084498 A1 | 3/2015 | Choi | |

FOREIGN PATENT DOCUMENTS

| | | |
|---|---|---|
| CN | 001429055 A | 7/2003 |
| EP | 0 776 147 A1 | 5/1997 |
| EP | 0 993 235 A2 | 4/2000 |
| EP | 1 058 314 A2 | 12/2000 |
| EP | 1 128 436 A1 | 8/2001 |
| EP | 1 148 467 A2 | 10/2001 |
| EP | 1 176 457 A2 | 1/2002 |
| EP | 1 176 850 A1 | 1/2002 |
| EP | 1 253 643 A2 | 10/2002 |
| EP | 1 376 713 A2 | 1/2004 |
| EP | 1 394 870 A2 | 3/2004 |
| EP | 1 536 496 A1 | 6/2005 |
| EP | 1 656 002 A2 | 5/2006 |
| EP | 1 870 948 A2 | 12/2007 |
| EP | 2 259 323 A2 | 12/2010 |
| EP | 2 262 030 A2 | 12/2010 |
| EP | 2 275 860 A2 | 1/2011 |
| JP | 05-299177 A | 11/1993 |
| JP | 09-148066 A | 6/1997 |
| JP | 10-335060 A | 12/1998 |
| JP | 11-271753 A | 10/1999 |
| JP | 2001-203076 A | 7/2001 |
| JP | 2001-357973 A | 12/2001 |
| JP | 2003-197367 A | 7/2003 |
| JP | 2003-229250 A | 8/2003 |
| JP | 2003-297552 A | 10/2003 |
| TW | 476227 | 2/2002 |
| TW | 477907 B | 3/2002 |
| TW | 519606 | 2/2003 |
| TW | 521237 | 2/2003 |
| TW | 525305 | 3/2003 |
| TW | 543338 | 7/2003 |
| WO | WO 1999/020081 A2 | 4/1999 |
| WO | WO 2000/033617 A1 | 6/2000 |
| WO | WO 2001/058221 A1 | 8/2001 |

OTHER PUBLICATIONS

European Search Report re Application No. EP 04019744.4, dated Nov. 16, 2009.
Chinese Office Action re Application No. CN 200810186334.7, dated Mar. 2, 2010.
Office Action re Chinese Application No. CN 200810186334.7, dated Nov. 22, 2011.
Korean Office Action re Application No. KR 10-2012-0008323, dated Jun. 8, 2012.
Taiwanese Office Action re Application No. TW 093125022, dated Jun. 20, 2012.

(56) References Cited

OTHER PUBLICATIONS

Taiwanese Office Action re Application No. TW 101139484, dated Jan. 23, 2015.
Taiwanese Office Action re Application No. TW 105135726, dated Jun. 27, 2017.

* cited by examiner

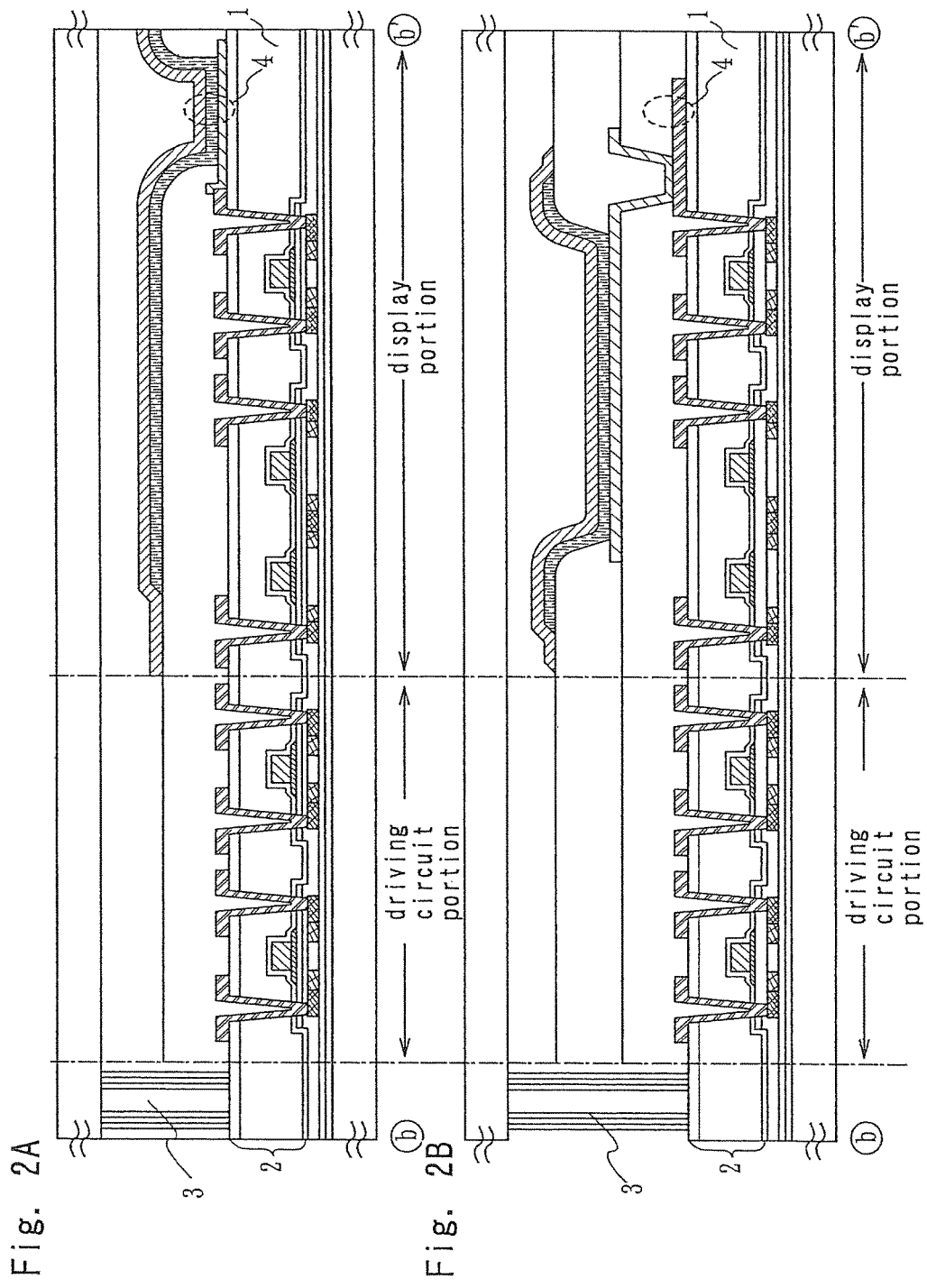

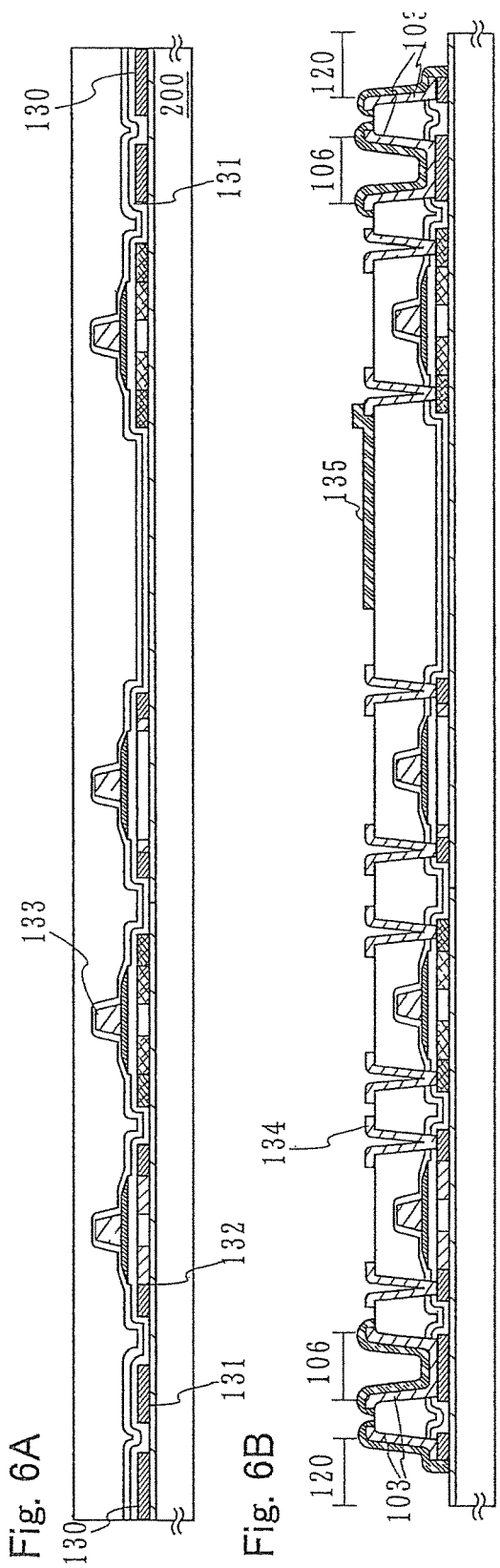
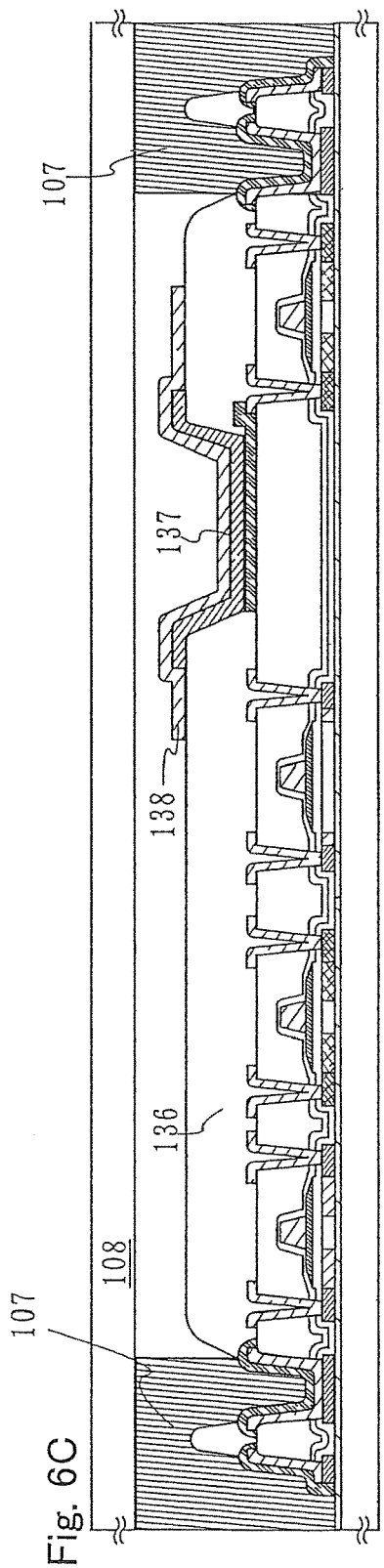
Fig. 6A
Fig. 6B
Fig. 6C

Fig. 8A
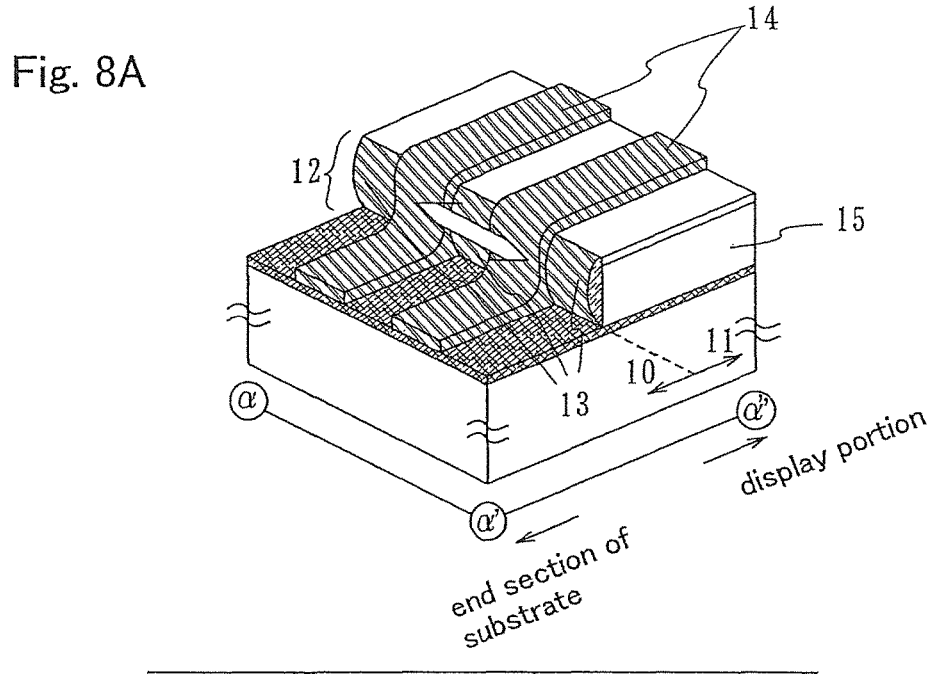
Fig. 8B
Fig. 8C
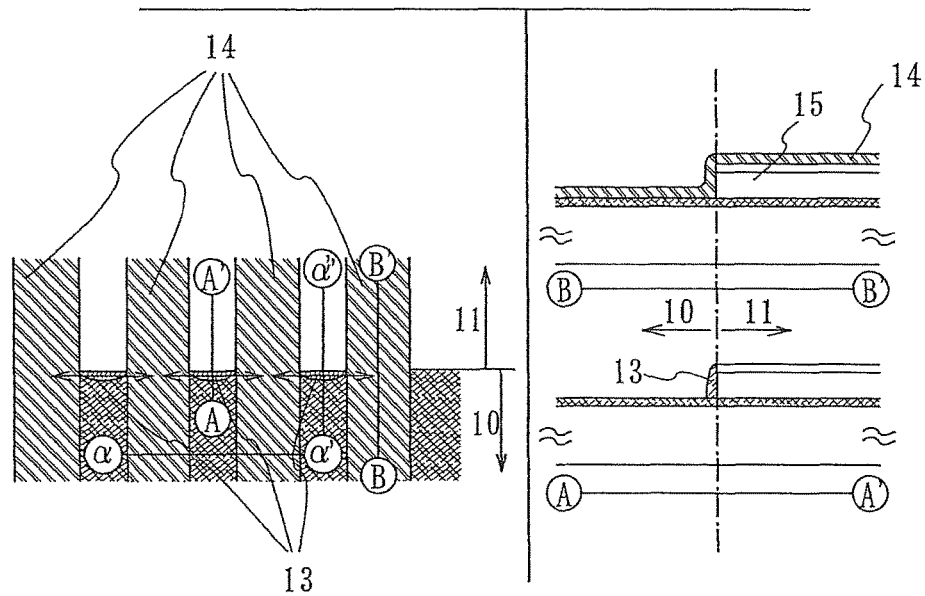

Fig. 9A
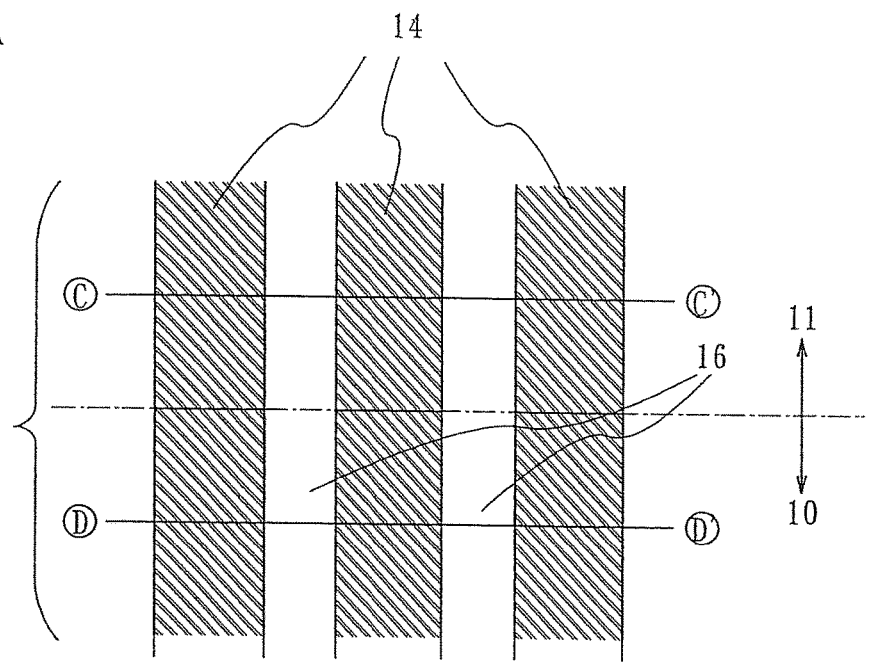
Fig. 9B
Fig. 9C
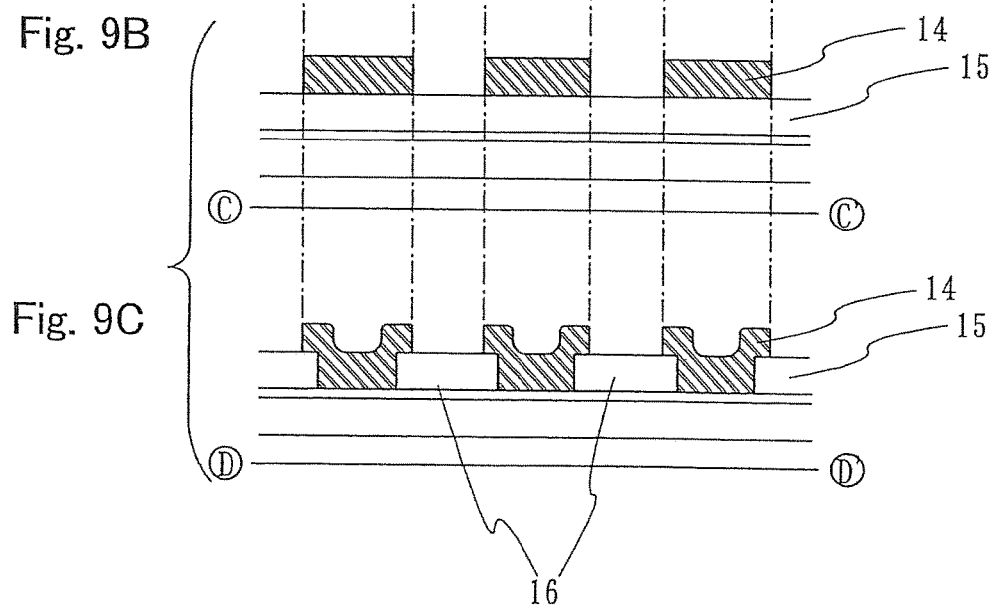

← end section of substrate    display portion →

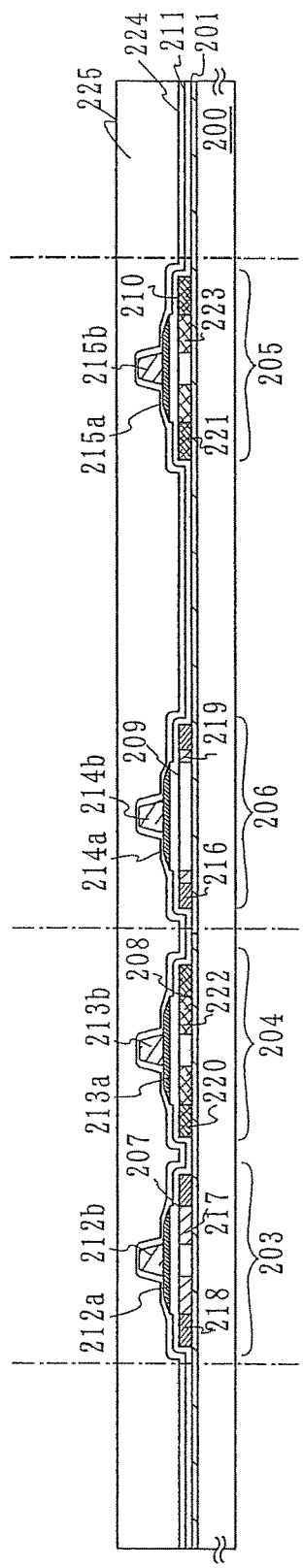
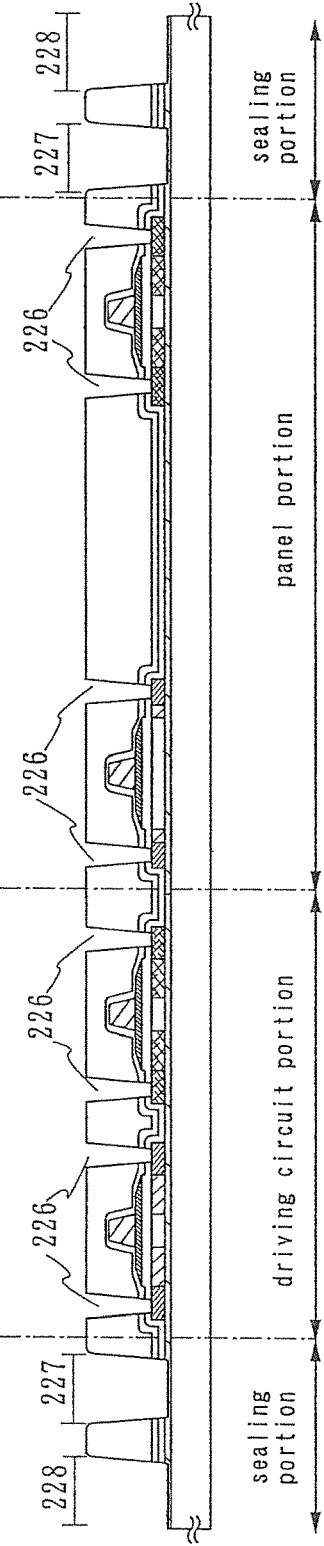
Fig. 14A
Fig. 14B

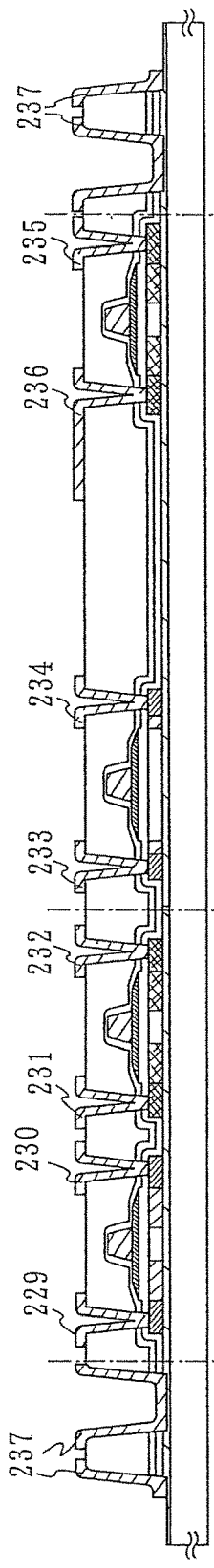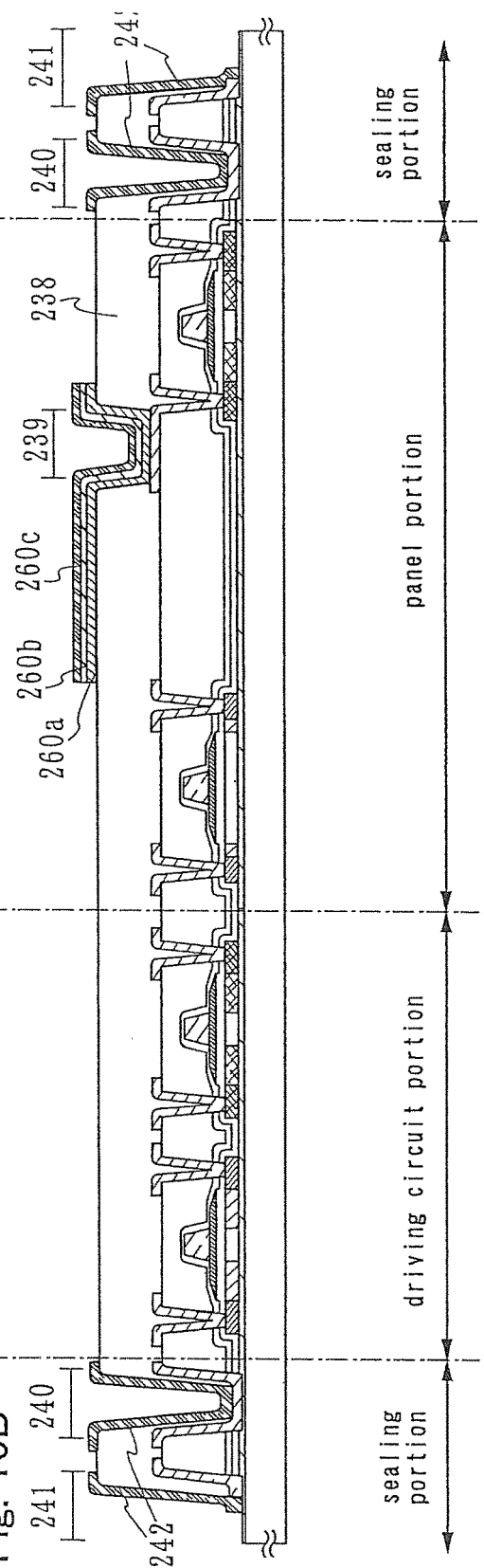
Fig. 15A
Fig. 15B

← end section of substrate    display portion →

← end section of substrate    display portion →

DISPLAY DEVICE AND METHOD FOR MANUFACTURING THE SAME

This application is a continuation of copending application Ser. No. 14/274,143 filed on May 9, 2014 which is a continuation of application Ser. No. 13/088,578 filed on Apr. 18, 2011 (now U.S. Pat. No. 8,723,417 issued May 13, 2014) which is a divisional of application Ser. No. 10/919,605 filed on Aug. 17, 2004 (now U.S. Pat. No. 7,928,654 issued Apr. 19, 2011) which are all incorporated herein by reference.

BACKGROUND OF THE INVENTION

1. Field of the Invention

The present invention relates to a display device formed using an element (light emitting element) which has a light-emitting material interposed between electrodes and emits light by applying current between the electrodes, and particularly, to a sealing structure of a light emitting element in such a display device.

2. Description of the Related Art

In recent years, a thin and lightweight display using a light emitting element has actively been developed. The light emitting element is formed by interposing a material which emits light by applying current between a pair of electrodes. A light source such as back light is not required since it itself emits light unlike in the case of liquid crystal, and the element itself is very thin. Therefore, it is extremely advantageous to form a thin and lightweight display.

Although the light emitting material of the light emitting element includes an organic one and an inorganic one, a light emitting element using an organic material that is driven with low voltage is often considered the most preferable. Drive voltage of a display having a light emitting element using an organic material is from 5 V to 10 V, and it is understood that it can be driven with very low voltage compared to an electroluminescent device using an inorganic material which requires drive voltage of from 100 V to 200 V. Drive voltage of a liquid crystal display singing the praises of low power consumption is approximately from 5 V to 15.5 V, and it is understood that the display having the light emitting element using an organic material can be driven with equal to or lower voltage than a liquid crystal display.

However, one background of not reaching a practical use yet while having such advantages is a problem of reliability. The light emitting element using an organic material often deteriorates due to moisture, and has a defect of being hard to obtain long-term reliability. The light emitting element which is deteriorated due to moisture causes decrease in luminance or does not emit light. It is conceivable that this causes a dark spot (black spot) and a shrink (decrease in luminance from an edge portion of a display device) in a display device using the light emitting element.

Various countermeasures are suggested to suppress such deterioration (for example, Reference 1: Japanese Patent Laid-Open No. 9-148066, and Reference 2: Japanese Patent Laid-Open No. 13-203076).

However, sufficient reliability is not obtained yet even when these countermeasures are taken, and thus, further improvement in reliability is expected.

SUMMARY OF THE INVENTION

It is an object of the present invention to provide such a sealing structure that a material to be a deterioration factor such as water or oxygen is prevented from entering from external and sufficient reliability is obtained in a display using an organic or inorganic light emitting element.

In view of the above object, deterioration of a light emitting element is suppressed and sufficient reliability is obtained by preventing water entry from an interlayer insulating film according to the present invention. In the present invention, at least one side of substrates is light transmitting in a light emitting device having a pixel portion made up of a light emitting element interposed between the substrates.

One structure of the present invention is a light emitting device comprising a light emitting element interposed between a pair of substrates, at least one of which is light transmitting, wherein the light emitting element is formed to be in contact with one of or both a first interlayer insulating film and a second interlayer insulating film, and a peripheral portion of the first interlayer insulating film and the second interlayer insulating film comprises: a first opening which penetrates the first interlayer insulating film; a first impermeable protective film covering the first opening and the first interlayer insulating film in the first opening; and a second opening which penetrates the second interlayer insulating film.

Another structure of the present invention is a light emitting device comprising a light emitting element interposed between a pair of substrates, at least one of which is light transmitting, wherein the light emitting element is formed to be in contact with one of or both a first interlayer insulating film and a second interlayer insulating film, and a peripheral portion of the first interlayer insulating film and the second interlayer insulating film comprises: a first opening which penetrates the first interlayer insulating film; a first impermeable protective film covering the first opening and the first interlayer insulating film in the first opening; a second opening which penetrates the second interlayer insulating film; and a second impermeable protective film covering the second opening and the second interlayer insulating film in the second opening and in contact with the first impermeable protective film on a bottom face of the second opening.

Another structure of the present invention is a light emitting device comprising a light emitting element interposed between a pair of substrates, at least one of which is light transmitting, wherein the light emitting element is formed to be in contact with one of or both a first interlayer insulating film and a second interlayer insulating film, a peripheral portion of the first interlayer insulating film and the second interlayer insulating film comprises: a first opening which penetrates the first interlayer insulating film; a first impermeable protective film covering the first opening and the first interlayer insulating film in the first opening; a second opening which penetrates the second interlayer insulating film; and a second impermeable protective film covering the second opening and the second interlayer insulating film in the second opening and in contact with the first impermeable protective film on a bottom face of the second opening, and the pair of substrates is fixed to each other with an impermeable composition in a region provided with the first opening and the second opening or in an outer side of the region.

Another structure of the present invention is a light emitting device according to the above structure, wherein the second impermeable protective film comprises the same material as an anode or cathode of the light emitting element.

Another structure of the present invention is a light emitting device according to the above structure, wherein the light emitting element is provided with a pixel portion connected to a thin film transistor.

Another structure of the present invention is a light emitting device according to the above structure, wherein the first impermeable protective film is made of the same material as a source electrode and a drain electrode of the thin film transistor.

Another structure of the present invention is a light emitting device according to the above structure, wherein a semiconductor film is formed in a lower portion of the first opening.

Another structure of the present invention is a light emitting device according to the above structure, wherein a metal film is formed in a lower portion of the first opening.

Another structure of the present invention is a light emitting device according to the above structure, wherein a semiconductor film is formed in a lower portion of the first opening, and the semiconductor film is made of the same material as an active layer of the thin film transistor.

Another structure of the present invention is a light emitting device according to the above structure, wherein a metal film is formed in a lower portion of the first to opening, and the metal film is made of the same material as a gate electrode of the thin film transistor.

Another structure of the present invention is a light emitting device according to the above structure, wherein at least a portion of a bottom face of the first opening and a portion of the bottom face of the second opening are formed in the same position on a face of the substrate.

Another structure of the present invention is a light emitting device according to the above structure, wherein a bottom face of the first opening and the bottom face of the second opening are formed in a different position on a face of the substrate.

Another structure of the present invention is a light emitting device according to the above structure, wherein a plurality of the first openings and the second openings is formed.

Another structure of the present invention is a light emitting device according to the above structure, wherein at least one layer of the first interlayer insulating film and the second interlayer insulating film is made of an organic material.

Another structure of the present invention is a light emitting device according to the above structure, wherein at least one layer of the first interlayer insulating film and the second interlayer insulating film is made of an inorganic material.

Another structure of the present invention is a light emitting device according to the above structure, wherein at least one layer of the first interlayer insulating film and the second interlayer insulating film is made of a siloxane film.

Another structure of the present invention is a light emitting device according to the above structure, wherein the organic material is acrylic or polyimide.

Another structure of the present invention is a light emitting device according to the above structure, wherein the first impermeable protective film or the second impermeable protective film is a silicon nitride film.

Another structure of the present invention is a light emitting device according to the above structure, wherein the first impermeable protective film and the second impermeable protective film are silicon nitride films.

Another structure of the present invention is a light emitting device comprising a light emitting element interposed between a pair of substrates, at least one of which is light transmitting, wherein the light emitting element is formed to be in contact with an interlayer insulating film, and a side edge portion of the interlayer insulating film formed inside not to reach an edge portion of the substrate is processed into a tapered shape.

Another structure of the present invention is a light emitting device comprising a light emitting element interposed between a pair of substrates, at least one of which is light transmitting, wherein the light emitting element is formed to be in contact with an interlayer insulating film, a side edge portion of the interlayer insulating film formed inside not to reach an edge, portion of the substrate is processed into a tapered shape, and an impermeable protective film is formed in the side edge portion of the interlayer insulating film.

Another structure of the present invention is a light emitting device comprising a light emitting element interposed between a pair of substrates, at least one of which is light transmitting, wherein the light emitting element is formed to be in contact with an interlayer insulating film, a side edge portion of the interlayer insulating film formed inside not to reach an edge portion of the substrate is processed into a tapered shape, an impermeable protective film is formed in the side edge portion of the interlayer insulating film, and the pair of substrates is fixed to each other with an impermeable composition in a region of the side edge portion of the interlayer insulating film or in an outer side of the region.

Another structure of the present invention is a light emitting device according to the above structure, wherein the light emitting element is provided with a pixel portion connected to a thin film transistor.

Another structure of the present invention is a light emitting device according to the above structure, wherein a semiconductor film is formed from a bottom portion of the interlayer insulating film to the edge portion of the substrate.

Another structure of the present invention is a light emitting device according to the above structure, wherein a metal film is formed from a lower portion of the interlayer insulating film to the edge portion of the substrate.

Another structure of the present invention is a light emitting device according to the above structure, wherein a semiconductor film is formed from a lower portion of the interlayer insulating film to the edge portion of the substrate, and the semiconductor film is made of the same material as an active layer of the thin film transistor.

Another structure of the present invention is a light emitting device according to the above structure, wherein a metal film is formed from a lower portion of the interlayer insulating film to the edge portion of the substrate, and the metal film is made of the same material as a gate electrode of the thin film transistor.

Another structure of the present invention is a light emitting device according to the above structure, wherein the interlayer insulating film is made of an organic material.

Another structure of the present invention is a light emitting device according to the above structure, wherein the interlayer insulating film is made of an inorganic material.

Another structure of the present invention is a light emitting device according to the above structure, wherein the interlayer insulating film is made of a siloxane film.

Another structure of the present invention is a light emitting device according to the above structure, wherein the organic material is acrylic or polyimide.

Another structure of the present invention is a light emitting device according to the above structure, wherein the impermeable protective film is a silicon nitride film.

Another structure of the present invention is a light emitting device comprising: a pixel portion made up of a light emitting element interposed between a pair of substrates, at least one of which is light transmitting; an external connection portion taking in a signal from external; and a plurality of wirings connecting the pixel portion and the external connection portion, wherein the pair of substrates is fixed to each other with an impermeable composition between the pixel portion and the external connection portion, the light emitting element is formed to be in contact with an interlayer insulating film, a part of the interlayer insulating film is located between adjacent wirings in the plurality of wirings, and the wiring is thickly provided with a plurality of bends in a lower portion of or inside a portion in which the substrates are fixed to each other with the impermeable composition.

According to the above structures, deterioration of a light emitting element in an electroluminescent device can be suppressed. In addition, reliability can drastically be improved.

These and other objects, features, and advantages of the present invention will to become more apparent upon reading of the following detailed description along with the accompanied drawings.

BRIEF DESCRIPTION OF THE DRAWINGS

FIGS. 2A and 2B show a conventional structure.
FIGS. 6A to 6C show Embodiment Mode 3.
FIGS. 8A to 8C show a conventional structure.
FIGS. 9A to 9C show Embodiment Mode 4.
FIGS. 14A and 14B show Embodiment 1.
FIGS. 15A and 15B show Embodiment 1.

DETAILED DESCRIPTION OF THE INVENTION

A mode carrying out the present invention is described hereinafter. Note that the same number refers to the same part or similar part in a drawing. In addition, description on the same part is omitted.

(Embodiment Mode 1)

In an electroluminescent device, an insulating film such as a silicon oxide film, a silicon nitride film, an acrylic film, a polyimide film, or a siloxane film is often used as an interlayer insulating film. Specifically, an acrylic film or a siloxane film is a preferable material since it can be formed by application and it has high planarity. However, it has comparatively high permeability on the other hand.

Figure 3:
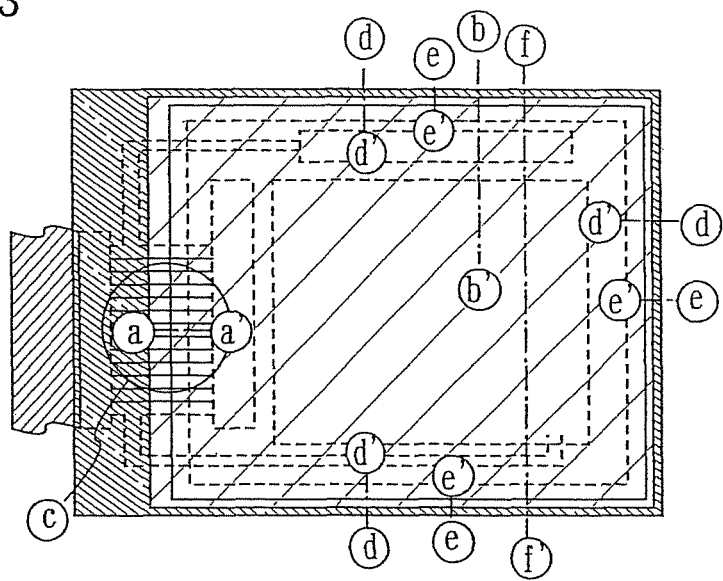
FIG. 3 is a top view of an electroluminescent device.

FIGS. 2A and 2B are cross-sectional views taken along a line b-b' in FIG. 3. In the case of conventional structures as shown in FIGS. 2A and 2B, an end face 2 of an interlayer insulating film 1 is always exposed to outer atmosphere. Therefore, there is a case that water enters through the interlayer insulating film and deterioration of a light emitting element is caused, even when an upper portion thereof is covered with an impermeable sealant 3 so that a light emitting element 4 is not exposed to outer air.

Figure 1A:
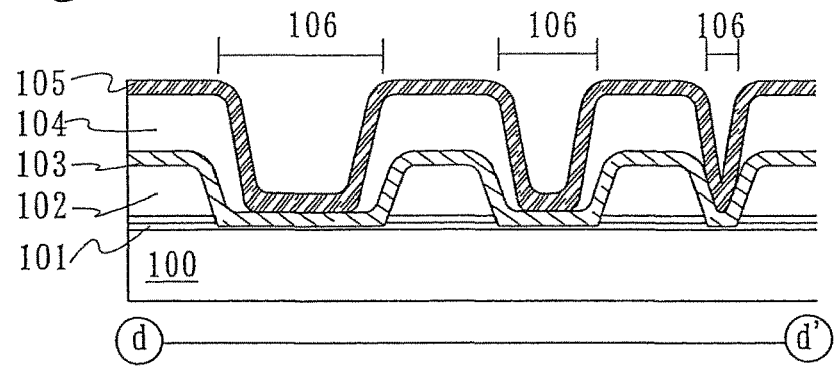
FIGS. 1A to 1C show Embodiment Mode 1.
Figure 1B:
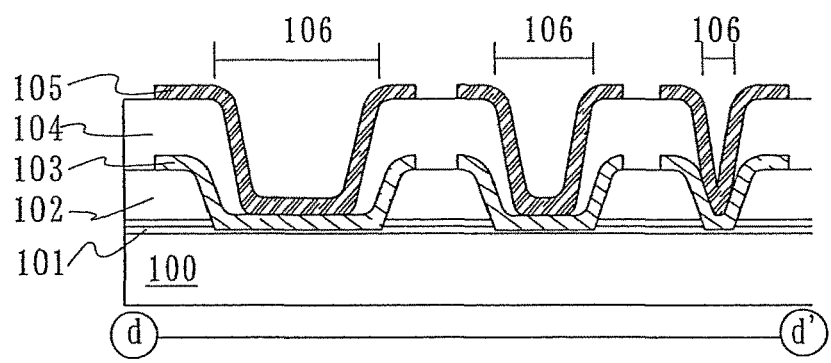
Figure 1C:
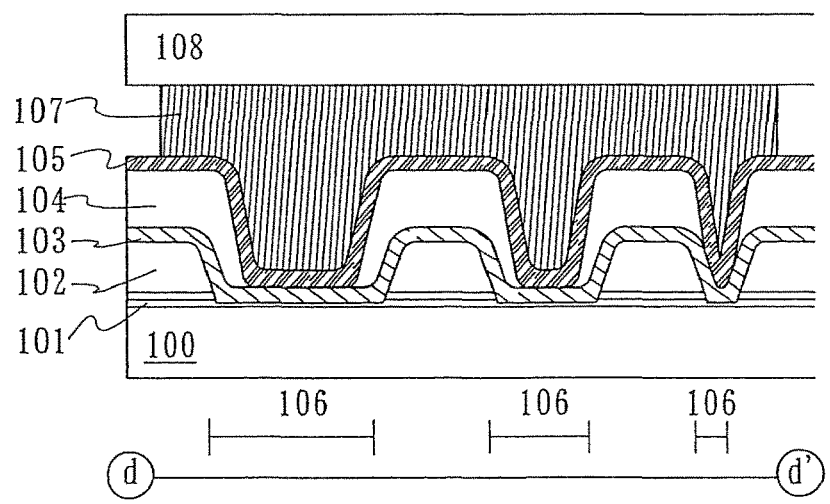

Thus, one of structures in the present invention for solving the problem is described with reference to FIGS. 1A to 1C. FIGS. 1A to 1C show an example of reducing water entry through the interlayer insulating film by covering inside of a groove formed on the periphery of the interlayer insulating film with an impermeable film (hereinafter, referred to as a protective film). FIGS. 1A to 1C correspond to a cross section taken along a line d-d' in FIG. 3, for example. Note that a sealant made of an impermeable material and an opposing substrate are omitted in FIGS. 1A and 1B. A state of the periphery of an electroluminescent device is shown. Reference numeral 100 denotes a substrate; 101, a base insulating film; 102, a first interlayer insulating film; 103, a first protective film; 104, a second interlayer insulating film; and 105, a second protective film.

In this structure, the first interlayer insulating film 102 and the second interlayer insulating film 104 are assumed comparatively highly permeable. In these highly permeable films, a groove-shaped opening 106 that penetrates each film in a thickness direction is formed. The protective films 103 and 105 are formed to cover at is least inside of the groove (to continuously cover an end face of an exposed interlayer insulating film and a film in a lower portion). In addition, the protective films 103 and 105 are in contact with each other at the opening 106.

When such a structure is employed, water entered from edge portions of the interlayer insulating films 102 and 104 is prevented from further entering by the impermeable protective films 103 and 105 formed on an end face of the groove-shaped opening 106. Since the groove-shaped opening 106 is formed to penetrate in a thickness direction, an entry path of water is blocked without providing the protective film. Therefore, providing the groove-shaped opening alone becomes a countermeasure for deterioration of a light emitting element due to water, depending on desired degree of reliability.

The groove-shaped opening 106 is the most effective when continuously formed all around the periphery of the permeable film However, when it is impossible, a certain degree of effect can be expected by forming the opening only on one side or partially since water entry at least from the portion can be reduced.

In FIGS. 1A to 1C, the groove-shaped opening 106 is repeatedly provided from the periphery of the interlayer insulating film to a region provided with a light emitting element, but only one groove-shaped opening 106 may as well be provided. However, reliability is further improved by repeatedly taking such measures.

When the protective films 103 and 105 are made of a wiring material, they can be used as a lead wiring which can be disposed on an outer boundary. Further, a difference between FIG. 1A and FIG. 1B is a difference whether the protective films 103 and 105 are independent in each opening or not. When employing such an independent structure in each opening as shown in FIG. 1B, the protective film in each opening can be used as a separate wiring.

Figure 4A:
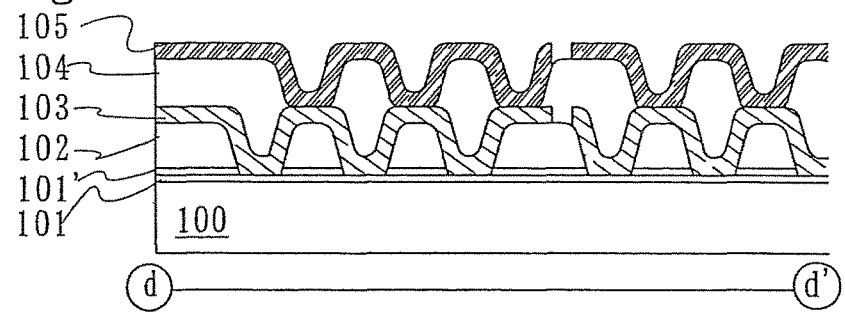
FIGS. 4A and 4B show variation of Embodiment Mode 1.
Figure 4B:
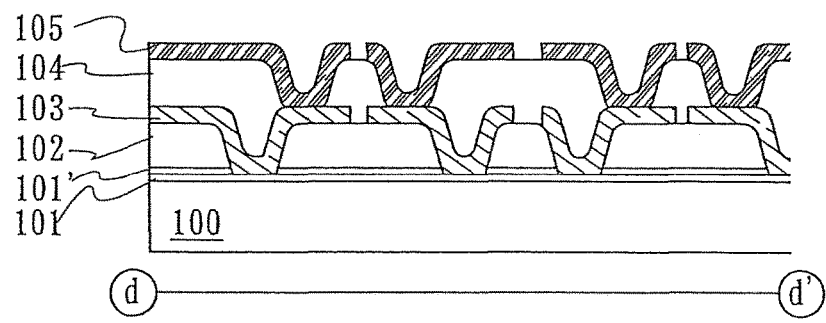

Other structures of suppressing water entry by such a groove-shaped opening and a protective film are conceivable, and some examples of them are given in FIGS. 4A and 4B. Cross-sectional views shown in FIGS. 4A and 4B also correspond to a line d-d' in FIG. 3 or the like. In addition, a sealant made of an impermeable material and an opposing substrate are omitted.

FIGS. 1A to 1C show an example that positions of a first opening formed in the first interlayer insulating film 102 and a second opening formed in the second interlayer insulating film 104 are the same; however, FIGS. 4A and 4B show an example that positions of the first opening formed in the first interlayer insulating film 102 and the second opening formed in the second interlayer insulating film 104 are different. Even such a structure can achieve an effect similar to the structure as shown in FIGS. 1A to 1C and can be formed in a short time since the second opening is shallower than that in FIGS. 1A to 1C. In addition, less attention to disconnection between steps needs to be paid since level difference becomes small. In FIG. 4A and FIG. 4B, a position in which an opening is formed is difference. Reference numeral 101' denotes a base insulating film in FIGS. 4A and 4B.

In addition, the substrate 100 provided with the light emitting element is fixed to an opposing substrate 108 with a sealant 107 made of an impermeable material, and the light emitting element is sealed from the outside. The sealant is more effective in suppressing water entry when formed in an upper portion of the groove-shaped opening 106.

In this embodiment mode, the case of two layers of the interlayer insulating films is described; however, the present invention can be applied in the case of one layer.

(Embodiment Mode 2)

In this embodiment mode, an example of a structure for preventing water from entering by removing a permeable film on the periphery of a substrate from the periphery of the substrate to a certain distance is described with reference to FIGS. 5A and 5B. Here, the permeable film is assumed an interlayer insulating film. However, an object is not limited to the interlayer insulating film and the present invention can be applied as a countermeasure for the permeable film. The cross-sectional views correspond to a line e-e' in FIG. 3.

Figure 5A:
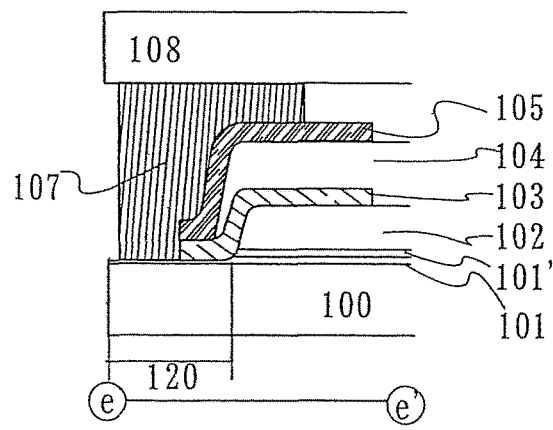
FIGS. 5A and 5B show Embodiment Mode 2.

Reference numeral 120 denotes a portion from which the interlayer insulating films 102 and 104 are removed on an end face of a substrate in FIG. 5A. In Embodiment Mode 1, the end faces of the interlayer insulating films 102 and 104 are exposed to outer air. Then, appropriate distance of the interlayer insulating films 102 and 104 on the end face of the substrate is removed in this embodiment mode, and the end faces thereof are covered with the protective films 103 and 105. Accordingly, exposure of the end face of the permeable film to outer air can be prevented; therefore, water entry itself can be blocked.

When the sealant 107 made of an impermeable material is formed on an outer side of the end face of the interlayer insulating film covered with the protective film or is formed to cover the entire end face of the interlayer insulating film in fixing the opposing substrate 108, water entry can further be prevented. Therefore, improvement in reliability can be expected. Reference numeral 101' denotes a base insulating film in FIGS. 5A and 5B.

Figure 5B:
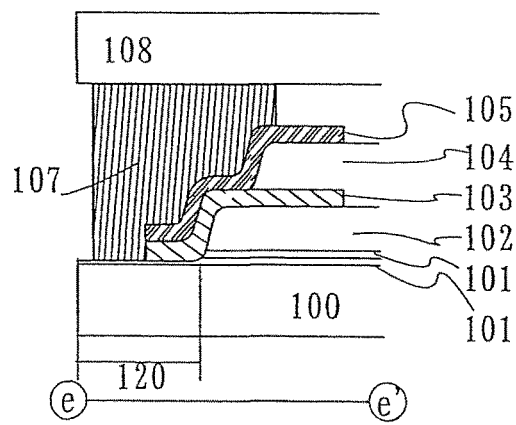

In addition, other structures in this embodiment mode are conceivable, and one example of them is shown in FIG. 5B. A difference between FIG. 5B and FIG. 5A is a removed position of the interlayer insulating films 102 and 104 at the end face of the substrate. FIG. 5A shows a structure in which the end face of the second interlayer insulating film 104 is located on the further outer side of the substrate than the end face of the first interlayer insulating film 102, and FIG. 5B shows a structure in which the end face of the first interlayer insulating film 102 is located on the further outer side of the substrate than the end face of the second interlayer insulating film 104.

Note that two layers of the interlayer insulating films are used in this embodiment mode; however, the present invention can be applied to an electroluminescent device having one layer of an interlayer insulating film.

Moreover, this embodiment mode is more effective when combined with Embodiment Mode 1.

(Embodiment Mode 3)

As is obvious referring to FIGS. 6A to 6C, in the case of manufacturing a sealing structure of the present invention, an opening 106 and an interlayer insulating film removed portion 1on an end face of a substrate can be formed simultaneously with opening of a contact hole formed in interlayer insulating films 102 and 104, which is effective.

However, a contact hole is etched under such a condition that the interlayer insulating film and a gate insulating film can be etched using a silicon semiconductor layer as an etching stopper. In the opening 106 and the interlayer insulating film removed portion 120 where an etching stopper does not exist, an etching residue may be generated, or a base insulating film 101 may be sharpened, thereby generating unevenness, in etching the first interlayer insulating film 102.

Figure 7A:
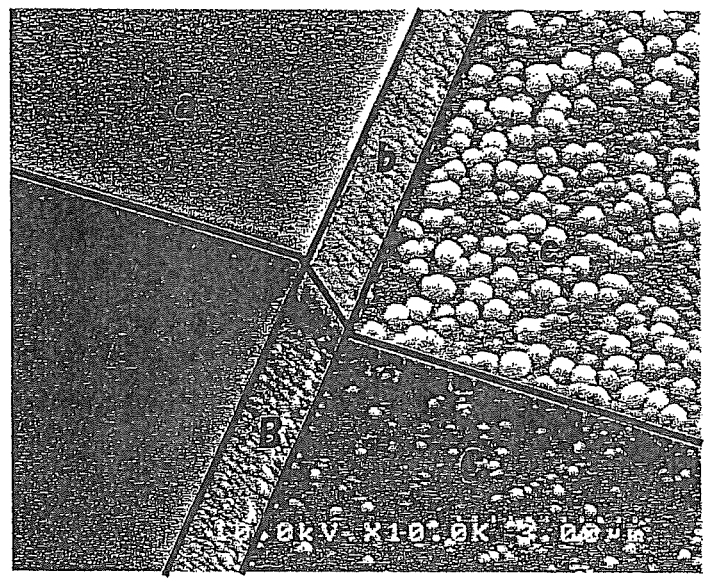
FIGS. 7A and 7B show Embodiment Mode 3.

FIG. 7A is a SEM picture of a sample in which a siloxane film is formed over a base film as an interlayer insulating film, a silicon nitride film is formed thereover, a part of the interlayer insulating film is removed under an opening condition of a contact hole, and then a wiring is provided. Regions indicated by "C" and "c" are regions from which the interlayer insulating film is removed, and regions "a", "b", and "c" are provided with a wiring. A region "A" is an original surface without being etched, "B" is an end face of the interlayer insulating film, and "C" is a surface of the base insulating film.

As is obvious seeing this, small unevenness as shown in the region "C" is generated when a contact hole is formed in the interlayer insulating film under the contact hole opening condition to reach the base insulating film. Then, large unevenness as shown in the region "c" is generated by foaming a wiring thereover. It is obvious from evenness of a wiring formed over the region "a" that this unevenness is caused by unevenness over the base insulating film after forming the opening. The wiring can be used as a protective film, and this may cause to generate unevenness over the protective film. In addition, coverage of the wiring itself becomes poor.

When such large unevenness is generated, adhesiveness of a sealant made of an impermeable material to be formed thereover may be in danger of being significantly affected. This is because water enters from a portion having poor adhesiveness when the sealant has poor adhesiveness, even when the sealant itself has low permeability.

Figure 7B:
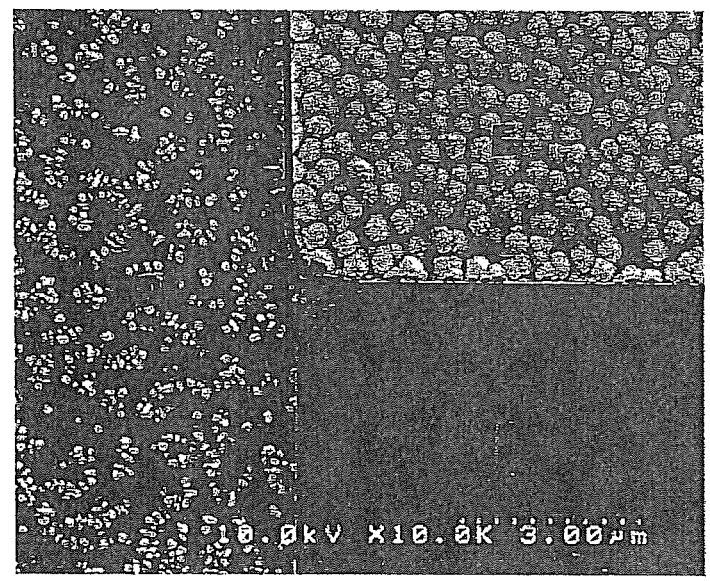

As in FIG. 7A, FIG. 7B is a SEM picture of a sample in which a siloxane film is formed over a base insulating film as an interlayer insulating film, the interlayer insulating film is removed under the contact hole opening condition, and then a wiring is provided. The region "C" in FIG. 7A corresponds to a region "D" in FIG. 7B, and the region "D" is a surface from which the interlayer insulating film is removed under the contact hole opening condition after forming a base insulating film and an interlayer insulating film in this order over the substrate. The region "c" in FIG.

7A corresponds to a region "E" in FIG. 7B, and the region "E" is a surface in which a wiring is formed over the region "D" in FIG. 7B.

On the other hand, a region "F" in FIG. 7B is a surface of a portion from which the interlayer insulating film is removed under the contact hole opening condition similarly as in the region "D" in FIG. 7B after forming the base insulating film, a silicon film, and the interlayer insulating film in this order over the substrate, that is, forming the silicon film serving as an etching stopper over the base insulating film and forming the interlayer insulating film thereover. Briefly, it has a structure of the region "D" in FIG. 7B provided with an etching stopper of the silicon film. Since the silicon film in the region "F" is removed by etching in forming the wiring in "E", the base insulating film can be seen similarly as in the region "D" in FIG. 7B. The region "F" has a very even surface in comparison with "D" in which a silicon film is not formed under the interlayer insulating film.

This is because the silicon film serves as an etching stopper film and suppresses generation of an etching residue of the interlayer insulating film in etching the interlayer insulating film and generation of unevenness due to gouge of the base insulating film.

On the basis of this, in this embodiment mode, etching stopper films 130 and 131 are formed in advance in a position to be provided with the opening 106 in FIGS. 1A to 1C and the interlayer insulating film removed portion 120 in FIGS. 5A and 5B (FIG. 6A). Cross-sectional views shown in FIGS. 6A to 6C correspond to a cross-section taken along a line f-f' in FIG. 3.

An example of forming such etching stopper films 130 and 131 by using a silicon film forming a semiconductor layer 132 of a thin film transistor (TFT) manufactured in a driver circuit portion or a pixel portion is described in this embodiment mode. However, any film can be used as the etching stopper films 130 and 131 as long as it functions as an etching stopper of the opening 106 and the interlayer insulating film removed portion 120 in removing the interlayer insulating film. It may be made of the same material as the semiconductor layer 132 simultaneously with formation of the semiconductor layer 132 as in this embodiment mode; it may be made of the same material as the gate electrode 133 simultaneously with formation of the gate electrode; or it may separately be made of another material. When it is formed simultaneously with the semiconductor layer 132 or the gate insulating film, it is advantageous since the number of processes does not increase.

The opening 106 and the interlayer insulating film removed portion 120 are formed simultaneously with a contact hole opening for the wiring. In this case, the etching stopper films 130 and 131 (silicon film) are formed in a lower portion of the opening 106 and the interlayer insulating film removed portion 120 in a light emitting device of the present invention. Therefore, unevenness due to an etching residue or gouge of the interlayer insulating film is not generated. If a wiring 134 to be formed later is formed to cover inside of the opening 106 and the end face of the interlayer insulating film in the interlayer insulating film removed portion 120, it also functions as a protective film 103. When the interlayer insulating film is removed using the etching stopper films 130 and 131, an etching residue or gouge over a lower film is not generated. Consequently, adhesiveness of the protective film 103 can be prevented from decreasing, and generation of unevenness on the protective film can be suppressed.

In this embodiment mode, the protective film 103 is made of the same metal film as a material for the wiring 134, and can be formed simultaneously with the step of forming the wiring. However, it may be made of another material in a different step.

In addition, the protective film 103 may further be covered with a material for an anode 135 of the light emitting element over a switching TFT of a pixel portion to be formed later. It can be expected that water entry can further be suppressed (FIG. 6B).

An opposing substrate 108 is fixed with a sealant 107 made of an impermeable material after forming the light emitting element. The sealant can block an entry path of water by being applied over the groove-shaped opening 106 and/or the interlayer insulating film removed portion 120 on the periphery of the substrate. Therefore, the sealant is highly effective in suppressing deterioration of the light emitting element. The light emitting element is formed by interposing a light emitting layer 137 between the anode 135 and a cathode 138, and the light emitting element is separated from every element by a partition 136 (FIG. 6C).

When this embodiment mode is applied, generation of unevenness of the protective film 103 over the groove-shaped opening 106 and the interlayer insulating film removed portion 120 on the periphery of the substrate are suppressed. Therefore, deterioration of adhesiveness of the sealant can be prevented, and water entry from a portion having poor adhesiveness can be suppressed, which improves reliability.

This embodiment mode can freely be combined with Embodiment Mode 1 or 2. When combined, water entry from external can further be prevented; accordingly, reliability of an electroluminescent device can further be improved.

(Embodiment Mode 4)

In this embodiment mode, a structure is described, which can suppress an effect of water entered through an interlayer insulating film in a structure in which it is difficult to remove an entire interlayer insulating film.

As described in Embodiment Modes 2 and 3, it is a very effective means of preventing water entry to remove an interlayer insulating film on the periphery of a substrate and not to expose an end face of an interlayer insulating film to outer air as much as possible by covering the end face of the interlayer insulating film with a protective film 103 (and 105) and a sealant 107. However, there may be a case that it is difficult to remove an entire interlayer insulating film, depending on a structure.

For example, a wiring portion connecting an external terminal and an internal circuit is considered (a region "c" in FIG. 3). The wiring is formed by removing an interlayer insulating film on the periphery of a substrate, forming a metal film serving as a wiring, and etching the metal film to have a desired shape of a wiring, when a structure in which an interlayer insulating film on the periphery of a substrate is removed (a structure in which an interlayer insulating film removed portion 120 is formed: Embodiment Modes 2 and 3) is employed.

However, there is a step 12 that an end face of an interlayer insulating film forms between a portion 10 from which an interlayer insulating film is removed and a portion 11 in which the interlayer insulating film remains. There is a case that a metal film formed in this portion is not sufficiently etched and remains. Such an etching residue 13 makes adjacent wirings 14 short circuit and causes a defect.

A measure that an interlayer insulating film 16 is left between the wirings 14 is taken as shown in FIG. 9 to lessen the interlayer insulating film which is exposed to outer air while preventing the short circuit. Accordingly, a defect due to the above described short circuit can be prevented with most of the interlayer insulating film prevented from being exposed to outer air. However, the interlayer insulating film left between the wirings cannot be removed and is always exposed to outer air; therefore, water entry from the portion cannot be prevented. Water entry from the interlayer insulating film remaining between the wirings may have an adverse effect when considered from the point of view of long-term reliability.

Water entry through the interlayer insulating film is caused by a diffusion phenomenon of water in the film. As for the diffusion phenomenon, it is assumed that time to reach a certain position is proportional to square of distance as is found by a formula of diffusion. Namely, when only the interlayer insulating film left between the wirings is an entry path of water, time for water which enters by diffusing in the interlayer insulating film left between electrodes to reach inside of an electroluminescent device can effectively be lengthened by taking the distance as long as possible.

Figure 10A:
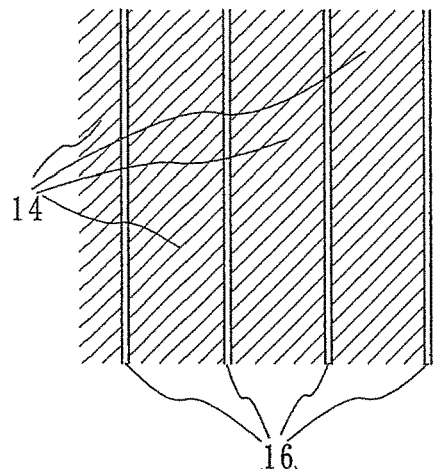
FIGS. 10A to 10F show Embodiment Mode 4.
Figure 10D:
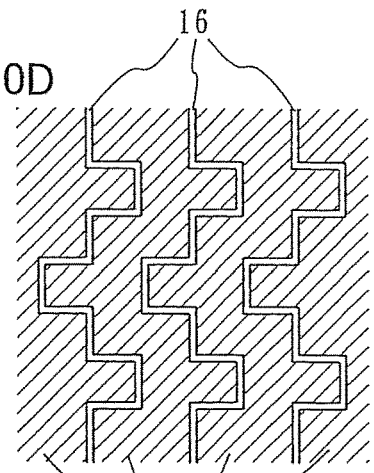
Figure 10B:
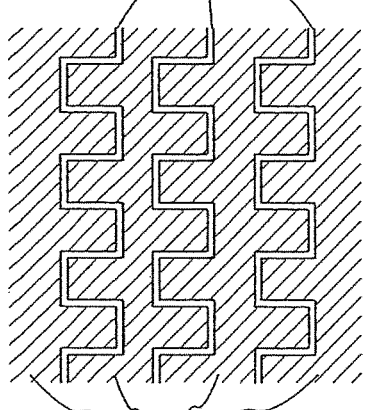
Figure 10E:
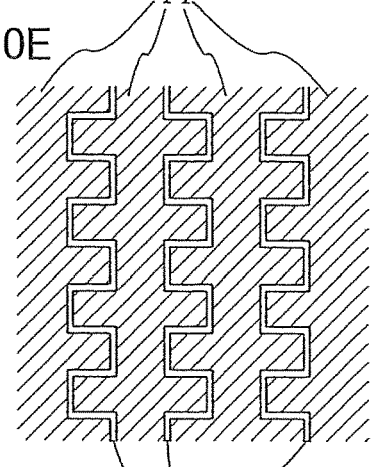
Figure 10C:
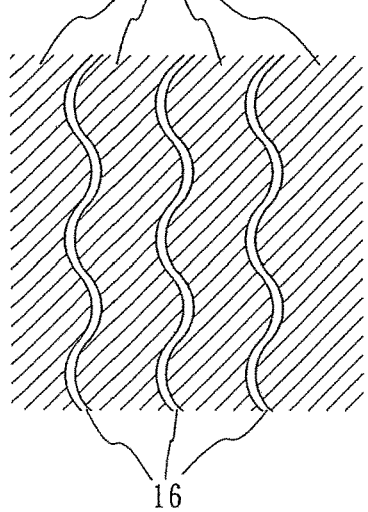
Figure 10F:
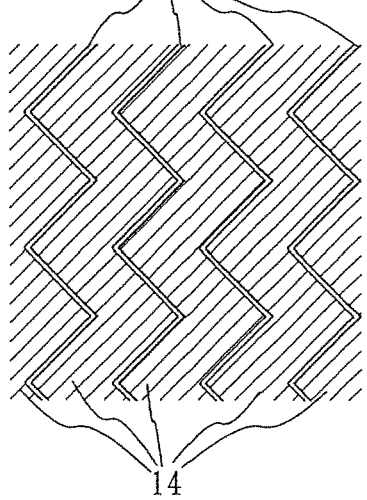

Conventionally, the wiring portion which connects an external terminal and an internal circuit is straight as shown in FIG. 10A besides a place where a bend is necessary in terms of layout, such as a corner. The wiring 14 is thickly provided with a plurality of bends as shown in FIG. 10B.

Then, substantial length of the interlayer insulating film 16 existing between the wirings can be lengthened, and a distance for water to diffuse in the interlayer insulating film before reaching inside of the electroluminescent device becomes longer. Consequently, time to start to deteriorate can largely be obtained, and longer-term reliability can be secured than ever before.

FIGS. 10C to 10F show examples of other conceivable structures for realizing this embodiment mode. When length of the interlayer insulating film between wirings gets longer even a little than the conventional structure in FIG. 10A, water entry can further be delayed than ever before. A desired pattern may be formed depending on necessity.

When this embodiment mode is applied, area of the interlayer insulating film between the wirings when looked from above of a light emitting device becomes large. Therefore, it is important to dispose a bend of the wiring in such a position that it is not exposed to outer air, that is, inside a sealant made of an impermeable material or in a lower portion of the sealant.

This embodiment mode can be applied by appropriately combining with Embodiment Modes 1 to 3. It is possible to effectively prevent water entry by separately applying Embodiment Modes according to its location, for example, applying this embodiment mode to a wiring portion connecting an external terminal and an internal circuit of an electroluminescent device (a region "c" in FIG. 3 or the like), and Embodiment Modes 1 and 2 to other outer peripheral portions. Further, in this embodiment mode, there is a step of removing an interlayer insulating film in forming a wiring portion. When the structure in Embodiment Mode 3 is employed on that occasion, generation of unevenness over the wiring can be suppressed. Therefore, adhesiveness of a sealant made of an impermeable material is improved, and water entry from an interface between the sealant and the wiring can drastically be decreased.

(Embodiment Mode 5)

Figure 11A:
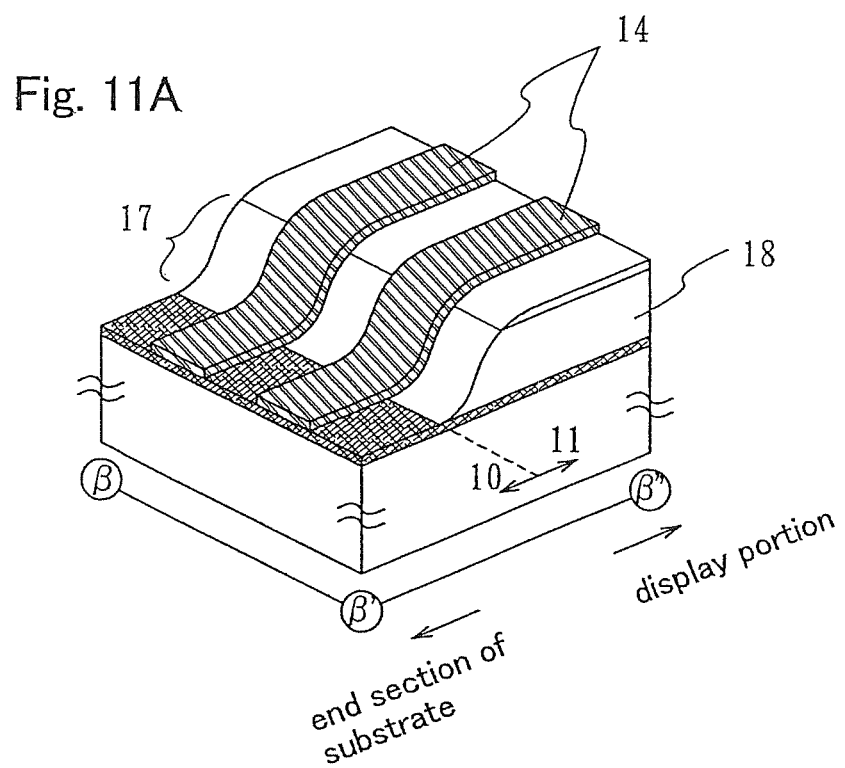
FIGS. 11A and 11B show Embodiment Mode 5.
Figure 11B:
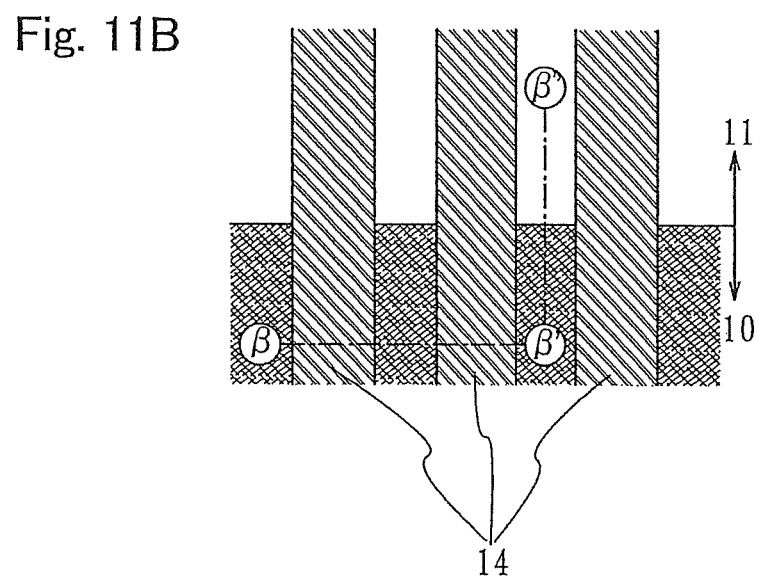

In this embodiment mode, a mode which can remove an interlayer insulating film on the periphery of a substrate also in a wiring portion (a region "c" in FIG. 3 or the like) connecting an external terminal and an internal circuit and prevent water entry through an interlayer insulating film is described with reference to FIGS. 11A and 11B.

It is only in a step 12 on an end face of an interlayer insulating film 15 where an etching residue is generated since it cannot be etched, as shown in FIG. 8. Since the end face of the interlayer insulating film is steep, a wiring material may not be etched by anisotropic dry etching employed for wiring formation and may remain in this portion. In such a wiring portion, it is difficult to employ isotropic etching typified by wet etching in terms of a margin of the wiring.

Thus, the end face 17 of the interlayer insulating film 18 is processed into a gently tapered shape in this embodiment mode. Accordingly, a wiring can certainly be etched even on the end face 17 of the interlayer insulating film, and an etching residue can be prevented from generating; therefore, it becomes unnecessary to leave the interlayer insulating film between the wirings 14 (FIGS. 11A and 11B).

As a result, the interlayer insulating film on the periphery of a substrate can entirely be removed in the wiring portion (a region "c" in FIG. 3 or the like) connecting an external terminal and an internal circuit. Moreover, a water path through the interlayer insulating film can completely be blocked by covering whole outer periphery than a position where the interlayer insulating film exists with an impermeable sealant. Then, reliability of an electroluminescent device can drastically be improved.

Note that the tapered end face of the interlayer insulating film may be processed with an inert gas such as argon. This densifies an end face of the wiring, and has an effect of making it harder for an impurity such as water to enter, compared to the case without processing. In addition, it is preferable to further form a nitride film such as a silicon nitride film to cover the tapered end face of the interlayer insulating film, since water entry from the end face can similarly be suppressed.

This embodiment mode can be applied by appropriately combining with Embodiment Modes 1 and 2. It is possible to effectively prevent water entry by separately applying Embodiment Modes according to its location and necessity, for example, applying this embodiment mode to a wiring portion connecting an external terminal and an internal circuit of an electroluminescent device, and Embodiment modes 1 and 2 to another outer peripheral portion.

(Embodiment Mode 6)

An example of combining Embodiment Mode 5 and Embodiment Mode 3 is described in this embodiment mode.

Figure 12A:
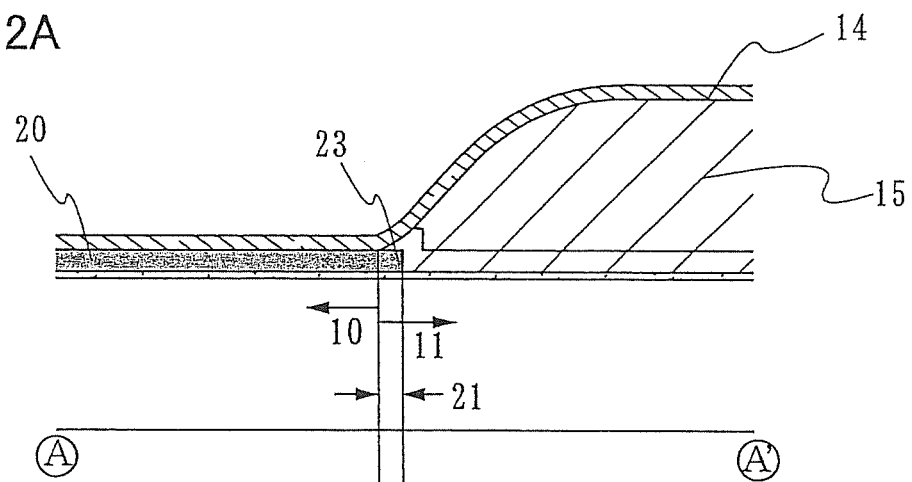
FIGS. 12A to 12C show Embodiment Mode 6.

In this embodiment mode combining Embodiment Mode 5 and Embodiment Mode 3, an etching stopper film 20 is formed in a portion 10 from which an interlayer insulating film is removed in order to suppress generation of unevenness caused in etching an interlayer insulating film. In this case, a film serving as an etching stopper is formed in a lower portion of a remaining interlayer insulating film 15 in terms of a margin 21 for forming an end face of an interlayer insulating film into a tapered shape (FIG. 12A).

Figure 12B:
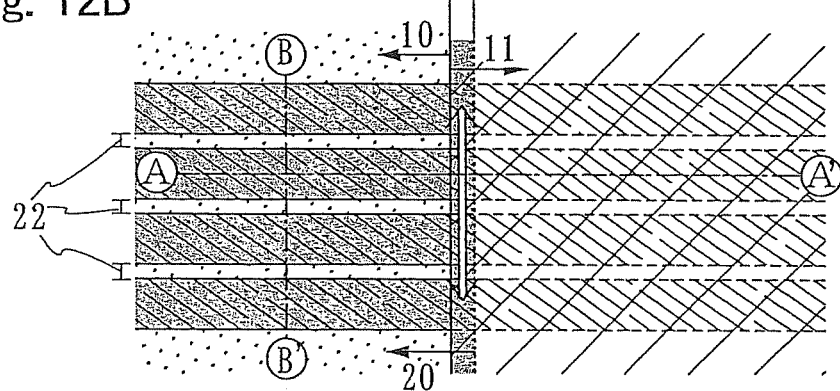
Figure 12C:
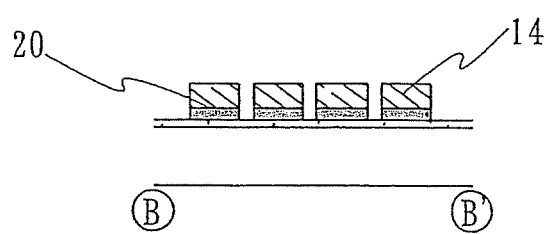
Figure 13A:
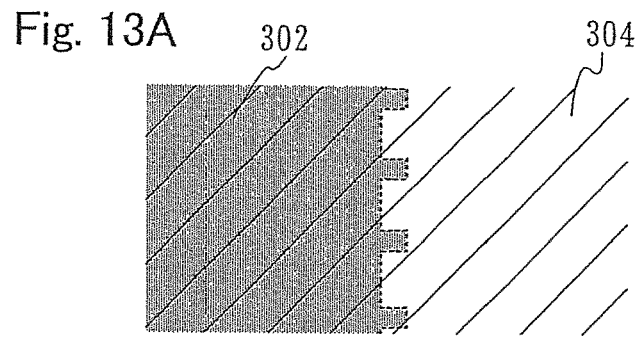
FIGS. 13A to 13D show Embodiment Mode 6.
Figure 13B:
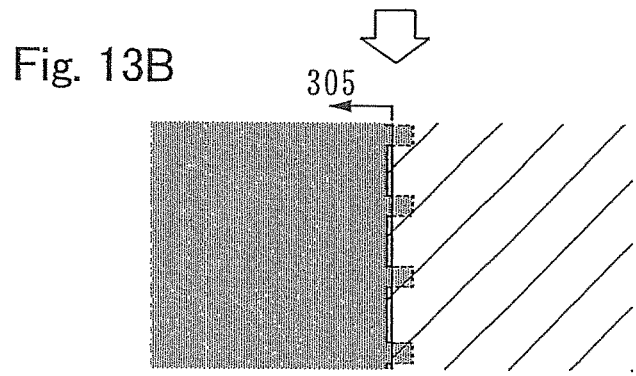
Figure 13C:
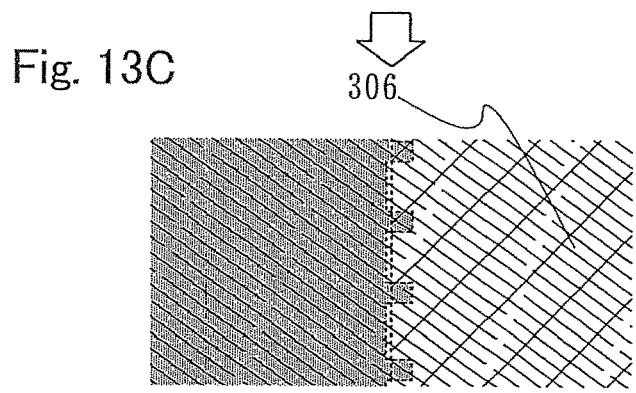
Figure 13D:
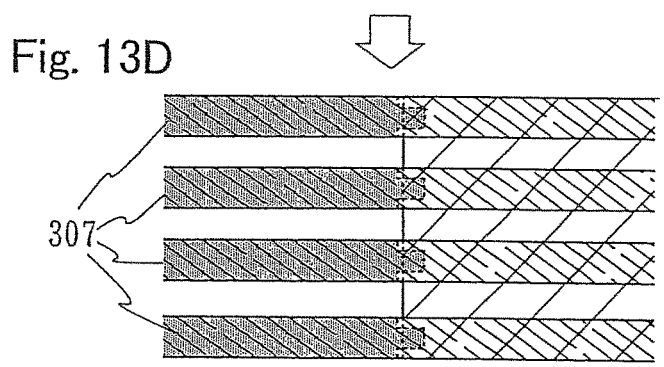
Figure 16A:
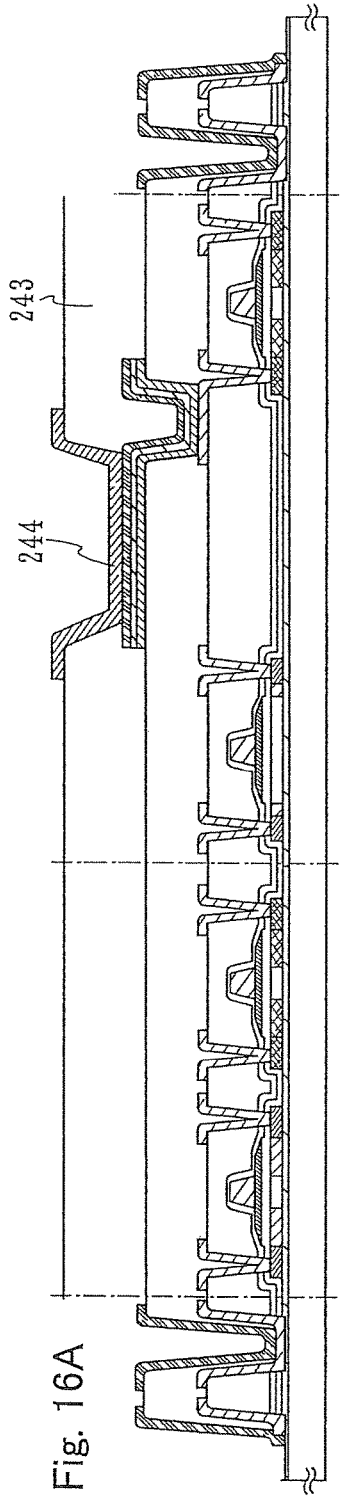
FIGS. 16A and 16B show Embodiment 1.
Figure 16B:
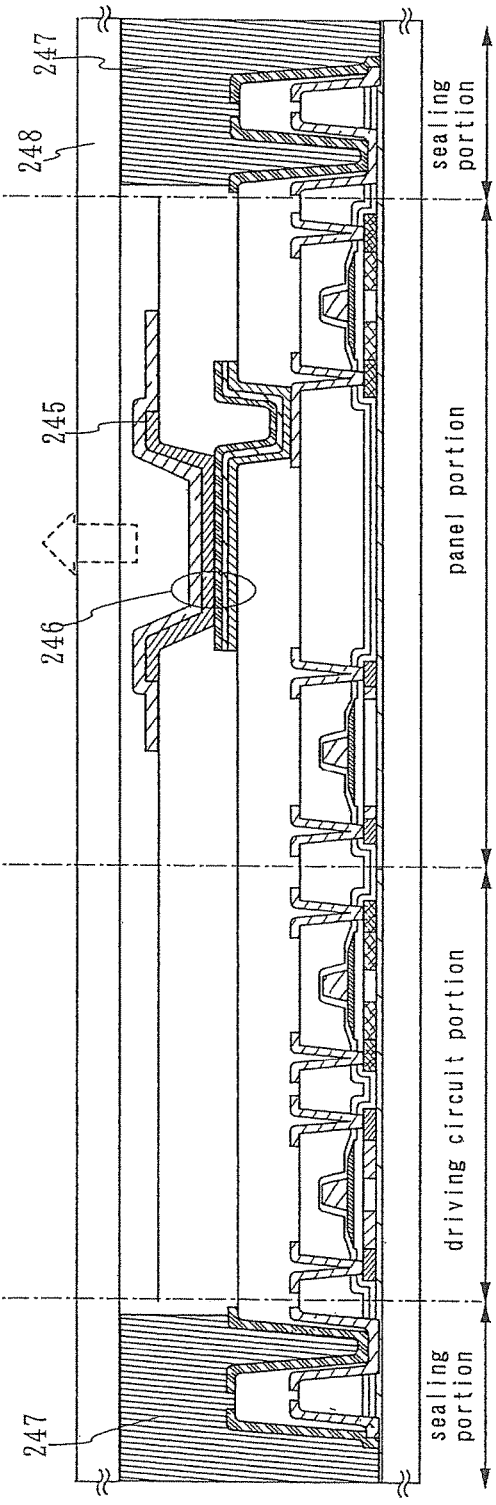

The etching stopper film 20 is formed over an entire surface of the interlayer insulating film removed portion 10, and a wiring 14 is formed thereover. Therefore, when the etching stopper film 20 has conductivity, all the wirings formed in the interlayer insulating film removed portion are short-circuited. However, the etching stopper film in a position 22 where a wiring is not formed is etched and removed with an unnecessary metal film in etching for forming a wiring shape, or is removed by performing appropriate etching again in the case where it cannot be removed by wiring etching. Therefore, there is no need to worry about a short circuit between wirings in the portion. However, an etching stopper film 23 located in a lower portion of the above described remaining interlayer insulating film (the etching stopper film 20 in a position of a taper formation margin 21) remains without being removed since it is covered with the interlayer insulating film. When the film has conductivity, a problem that wirings are short-circuited through the portion is caused (ref. FIG. 12B).

Such a problem does not occur when the etching stopper film is made of an insulating film. However, in the case of forming the etching stopper film without increasing the number of steps, the problem notably occurs since a conceivable film is a silicon film used for a semiconductor layer or a metal film used for a gate electrode and both of them have conductivity.

In this embodiment mode, among the etching stopper film formed below the interlayer insulating film, an etching stopper film is not formed between wirings from the beginning (FIGS. 13A to 13D). Among the etching stopper film formed below the interlayer insulating film, an etching stopper film is formed to be separated from the etching stopper film located in a lower portion of the wiring (FIGS. 18F to 18I).

When this structure is employed, generation of unevenness in removing an interlayer insulating film can be suppressed also in a wiring portion connecting an external terminal and an internal circuit and unevenness of a wiring can also be suppressed. Accordingly, decrease in adhesiveness of a sealant due to unevenness of a lower film can be prevented, and water entry from a portion having poor adhesiveness of a sealant can drastically be reduced. Consequently, reliability of an electroluminescent device is exceedingly improved.

[Embodiment 1]

In this embodiment, a detailed embodiment of Embodiment Mode 1 and Embodiment Mode 2 is described with reference to FIGS. 14A and 14B, 15A and 15B, and 16A and 16B.

A first interlayer insulating film 225 is formed over a substrate 200 provided with a base insulating film 201, a driver circuit transistor (only an n-channel thin film transistor 203 and a p-channel thin film transistor 204 are shown in the drawing), and a thin film transistor in a pixel portion (only a switching transistor 205 and a current control transistor 206 are shown in the drawing).

An insulating substrate such as a glass substrate, a quartz substrate, or a crystalline glass, a ceramic substrate, a stainless steel substrate, a metal substrate (tantalum, tungsten, molybdenum, or the like), a semiconductor substrate, a plastic substrate (polyimide, acrylic, polyethylene terephthalate, polycarbonate, polyarylate, polyethersulfone, or the like), or the like can be used as the substrate 200, but a material which can withstand at least heat generated during a process. In this embodiment, a glass substrate is employed.

A silicon oxide film, a silicon nitride film, a silicon oxynitride film, or the like can be used as the base insulating film 201. These are formed by using a known method such as sputtering, low pressure CVD, plasma CVD, or the like. In this embodiment, a silicon nitride oxide film is formed to be 100 nm in thickness.

Subsequently, an amorphous semiconductor film is formed. The amorphous semiconductor film may be made of silicon or a material containing silicon as its main component (for example, SixGe1-x, or the like) to have a desired thickness. As a manufacturing method, a known method such as sputtering, low pressure CVD, plasma CVD can be employed. In this embodiment, the amorphous semiconductor film is made of amorphous silicon to be 50 nm in thickness.

Next, amorphous silicon is crystallized. A step of performing laser crystallization after adding an element that promotes crystallization and crystallizing by heat treatment is described in this embodiment.

A thin film of a nickel solution is formed on the surface of the semiconductor film by applying with a spinner a nickel acetate solution or a nickel nitrate solution containing nickel in a concentration of from 5 ppm to 10 ppm in terms of weight. The nickel element may be sprayed on the whole surface of the semiconductor film by sputtering instead of application. As a catalytic element, one of or a plurality of elements such as iron (Fe), palladium (Pd), tin (Sn), lead (Pb), cobalt (Co), platinum (Pt), copper (Cu), and gold (Au) may be used as well as nickel (Ni).

Subsequently, the amorphous semiconductor film is crystallized by heat treatment. It may be carried out at a temperature of from 500° C. to 650° C. for about 4 hours to 24 hours since a catalytic element is used. The semiconductor film becomes a crystalline semiconductor film according to this crystallization process.

Subsequently, crystallization by a laser is performed to improve crystallinity. For laser crystallization, a pulse oscillation or continuous oscillation gas, solid, or metal laser oscillation device may be used. A laser oscillated from a laser oscillation device may be radiated in a linear shape by using an optical system.

The semiconductor film crystallized by using metal that promotes the crystallization as in this embodiment contains a metal element used for crystallization in the film. As this residue may cause various disadvantages, the concentration thereof is required to be lowered by gettering.

First, the surface of the crystallized semiconductor film is treated with ozone water, and then a barrier film is formed to have a thickness of from 1 nm to 5 nm, over which a gettering site is formed by sputtering. The gettering site is formed by depositing an amorphous silicon film containing an argon element of 50 nm in thickness. Thereafter, gettering is carried out by heating at 750° C. for 3 minutes by using a lamp annealing device to remove the gettering site.

After gettering, the crystalline semiconductor film is etched into semiconductor layers 207 to 210 having desired shapes. Thereafter, a gate insulating film 211 is formed. An insulating film containing silicon may be formed in a thickness of approximately 115 nm by low pressure CVD, plasma CVD, sputtering, or the like. A silicon oxide film is formed in this embodiment.

A tantalum nitride (TaN) film of 30 nm in thickness is formed as a first conductive layer over the gate insulating film 211, and a tungsten (W) film of 370 nm in thickness is formed as a second conductive layer thereover. Note that the first conductive layer is a TaN film of 30 nm in thickness and the second conductive layer is a W film of 370 nm in thickness in this embodiment; however, the present invention is not limited thereto. The first and second conductive layers may be made of any element selected from Ta, W, Ti, Mo, Al, Cu, Cr, and Nd, or an alloy or compound material having the above element as a main component. Furthermore, a semiconductor film typified by a polycrystalline silicon film doped with an impurity element such as phosphorous may be used. The first conductive layer may be formed to have a thickness of from 20 nm to 100 nm, and the second conductive layer may be formed to have a thickness of from 100 nm to 400 nm. In this embodiment, a laminated structure of two layers is employed; however, a single layer structure may be employed, or three or more layers may be laminated as well.

In order to form an electrode and a wiring by etching the conductive layer, a resist is formed as a mask through exposure to light by photolithography. First etching treatment is carried out under first and second etching conditions. Etching is carried out using the mask made of a resist to form a gate electrode and a wiring. An etching condition may be determined in each case.

In this method, ICP (Inductively Coupled Plasma) etching is used. As the first etching condition, $CF_4$, $Cl_2$, and $O_2$ are used as an etching gas with the gas-flow ratio of 25/25/10 (sccm), and a pressure of 1.0 Pa and an RF (13.56 MHz) power of 500 W is applied on a coil electrode to generate plasma for etching. An RF (13.56 MHz) power of 150 W is applied to a substrate side (sample stage) to apply a substantially negative self bias voltage. The W film is etched under the first etching condition to make an edge portion of the first conductive layer into a tapered shape. An etching rate on the W film under the first etching condition is 200.39 nm/min, the etching rate on the TaN film is 80.32 nm/min, and the selectivity ratio of W relative to TaN is approximately 2.5. Further, a taper angle of the W film is about 26° under the first etching condition.

Subsequently, etching is carried out under the second etching condition. Etching is performed for about 15 seconds with the resist as a mask remained, by using $CF_4$ and $Cl_2$ as an etching gas with the gas-flow ratio of 30/30 (sccm), and a pressure of 1.0 Pa and an RF (13.56 MHz) power of 500 W is applied on the coil electrode to generate plasma for etching. An RF (13.56 MHz) power of 20 W is applied to a substrate side (sample stage) to apply a substantially negative self bias voltage. Under the second etching condition in which $CF_4$ and $Cl_2$ are mixed, both of the W film and the TaN film are etched to the same extent. The edge portions of the first and second conductive layers become tapered in the first etching due to bias voltage applied to the substrate.

The second etching is carried out without removing the resist as a mask. The second etching is performed using $SF_6$, $Cl_2$, and $O_2$ as an etching gas with the gas-flow ratio of 24/12/24 (sccm), and a pressure of 1.3 Pa and an RF (13.56 MHz) power of 700 W is applied on the coil electrode to generate plasma for etching for about 25 seconds. An RF (13.56 MHz) power of 10 W is applied to a substrate side (sample stage) to apply a substantially negative self bias voltage. The W film is selectively etched under this etching condition to form a conductive layer in a second shape. The first conductive layer is hardly etched at this time. Gate electrodes including the first conductive layers 212a to 215a and the second conductive layers 212b to 215b are formed by the first and second etching.

First doping is carried out without removing the resist as a mask. Thus, an N-type impurity is doped in a low concentration into a crystalline semiconductor layer. The first doping may be performed by ion doping or ion implantation. The ion doping may be performed with the dose amount of from $1\times10^{13}$ atoms/cm$^2$ to $5\times10^{14}$ atoms/cm$^2$, and an acceleration voltage of from 40 kV to 80 kV. The ion doping is carried out at an acceleration voltage of 50 kV in this embodiment. The N-type impurity may be an element belonging to the group 15 of the periodic table typified by phosphorous (P) or arsenic (As). Phosphorous (P) is used in this embodiment. The first conductive layer is used as a mask to form a first impurity region (N$^-$ region) in a self-aligned manner to which an impurity of low concentration is doped.

Subsequently, the resist as a mask is removed. Then, a mask made of a resist is newly formed and the second doping is carried out at a higher acceleration voltage than the first doping. The N-type impurity is doped in the second doping as well. The ion doping may be performed with the dose amount of from $1\times10^{13}$ atoms/cm$^2$ to $3\times10^{15}$ atoms/cm$^2$, and an acceleration voltage of from 60 kV to 120 kV. The ion doping is carried out with the dose amount of $3.0\times10^{15}$ atoms/cm$^2$ and an acceleration voltage of 65 kV in this embodiment. The second doping is carried out so that the impurity element is doped into the semiconductor layer under the first conductive layer by using the second conductive layer as a mask against the impurity element.

By the second doping, a second impurity region (N$^-$ region, Lov region) is formed on the part where the second conductive layer is not overlapped or the part which is not covered with the mask in the part where the crystalline semiconductor layer is overlapped with the first conductive layer. The N-type impurity of which concentration ranging from $1\times10^{18}$ atoms/cm$^3$ to $5\times10^{19}$ atoms/cm$^3$ is doped into the second impurity region. Further, the exposed part (third impurity region: N$^+$ region) which is not covered with either the conductive layer in a first shape nor the mask is doped with a high concentration N-type impurity ranging from $1\times10^{19}$ atoms/cm$^3$ to $5\times10^{21}$ atoms/cm$^3$. The semiconductor layer has an N$^+$ region, a part of which is covered only with the mask. The concentration of the N-type impurity of this part is not changed from the impurity concentration of the first doping. Therefore, this part is referred to as the first impurity region (N$^-$ region) as it is.

Note that each impurity region is formed by two doping treatment in this embodiment; however, the invention is not exclusively limited to this. The impurity region having a desired impurity concentration may be formed by one or multiple doping by determining the condition in each case.

Subsequently, the resist as a mask is removed and a mask made of a resist is newly formed for third doping. By the third doping, a fourth impurity region (P$^+$ region) and a fifth impurity region (P$^-$ region) are formed in which an impurity element having the opposite conductivity to the ones of the first and second conductive layers is added to a semiconductor layer serving as a P channel TFT.

The fourth impurity region (P$^+$ region) is formed on the part which is not covered with the resist as a mask and not overlapped with the first conductive layer, and the fifth impurity region (P$^-$ region) is formed on the part which is not covered with the resist as a mask, overlapped with the first conductive layer, and not overlapped with the second conductive layer. The P-type impurity element may be boron (B), aluminum (Al), or gallium (Ga), each of which belongs to the group 13 of the periodic table.

In this embodiment, boron is used as a P-type impurity element to form the fourth and fifth impurity regions by ion doping using diborane ($B_2H_6$). Ion doping is carried out with the dose amount of $1\times10^{16}$ atoms/cm$^2$ and an acceleration voltage of 80 kV.

Note that semiconductor layers 207 and 209 for forming N-channel TFTs are covered with the mask made of a resist in the third doping.

The fourth impurity region (P$^+$ region) and the fifth impurity region (P$^-$ region) are doped with phosphorous of different concentrations by the first and second doping. However, in both of the fourth impurity region (P$^+$ region) and the fifth impurity region (P$^-$ region), the third doping is performed so that the concentration of the P-type impurity element is from $1\times10^{19}$ atoms/cm$^2$ to $5\times10^{21}$ atoms/cm$^2$. Therefore, the fourth impurity region (P$^-$ region) and the fifth impurity region (P⁻ region) work as a source region and a drain region of a P-channel TFT without problems.

It should be noted that the fourth impurity region (P⁺ region) and the fifth impurity region (P⁻ region) are formed by once third doping; however, the invention is not exclusively limited to this. The fourth impurity region (P⁺ region) and the fifth impurity region (P⁻ region) may be formed by multiple doping treatments according to each condition.

By the aforementioned doping treatment, a first impurity region (N⁻ region) 216, a second impurity region (N⁻ region, Lov region) 217, third impurity regions (N⁺ region) 218 and 219, fourth impurity regions (P⁺ region) 220 and 221, and fifth impurity regions (P⁻ region) 222 and 223 are formed.

Thereafter, a first passivation film 224 is formed over a gate electrode and a gate insulating film. A silicon nitride film, a silicon oxynitride film, or a silicon nitride oxide film containing hydrogen is formed as the first passivation film.

Subsequently, the first interlayer insulating film 225 is formed. After a siloxane polymer is entirely applied as the first interlayer insulating film, it is dried by heat treatment at a temperature of from 50° C. to 200° C. for 10 minutes, and baking treatment is performed at a temperature of from 300° C. to 450° C. for 1 hour to 12 hours. A siloxane film having a thickness of 1 μm, in which a skeletal structure is made up of a bond of silicon (Si) and oxygen (O), is formed over an entire surface by the baking. This step can hydrogenate a semiconductor layer by hydrogen contained in the first passivation film 224 as well as baking the siloxane polymer; consequently, the number of steps can be reduced and processes can be simplified.

An inorganic insulating film, an organic material resin, a low-k material, or the like formed by a known method such as a CVD method can be used for the first interlayer insulating film.

Thereafter, a silicon nitride oxide film or a silicon oxynitride film may be formed by a CVD method to cover the first interlayer insulating film 225. When a conductive film to be formed later is etched, this film functions as an etching stopper and can prevent the interlayer insulating film from being overetched. Further, a silicon nitride film may be formed thereover by sputtering. The silicon nitride film has a function of suppressing movement of an alkaline metal ion; therefore, a metal ion from a pixel electrode to be formed later, such as a lithium element or sodium can be prevented from moving to a semiconductor thin film.

Subsequently, the first interlayer insulating film is patterned and etched to form a contact hole 226 reaching the thin film transistors 203 to 206, a groove-shaped opening 227, and an interlayer insulating film removed portion 228 on the periphery of a substrate.

The contact hole 226, the opening 227, and the interlayer insulating film removed portion 228 can be formed by etching the siloxane film using a mixed gas of $CF_4$, $O_2$, and He, and then etching and removing the silicon oxide film that is a gate insulating film using a $CHF_3$ gas.

Subsequently, a metal film is laminated within the contact hole 226 and is patterned to form a source electrode and a drain electrode. In this embodiment, a titanium film including a nitrogen atom, a titanium-aluminum alloy film, and a titanium film are laminated to be 100 nm/350 nm/100 nm in thickness, respectively. Then, the films are patterned and etched into a desired shape to form source/drain electrodes 229 to 235 and a pixel electrode 236 of three layers.

A titanium film including a nitrogen atom in the first layer is formed by sputtering using titanium as a target with a flow rate of nitrogen and argon set 1:1. When the titanium film including a nitrogen atom as described above is formed over an interlayer insulating film made of a siloxane film, a wiring which is hardly peeled and which has a low resistance connection with a semiconductor region can be formed.

In this embodiment, a top gate polysilicon TFT is formed in both a driver circuit portion and a pixel portion; however, a TFT in the pixel portion may be a TFT using amorphous silicon as an active layer or a TFT using microcrystalline silicon as an active layer. In addition, a bottom gate TFT can naturally be used.

At the same time that a source electrode and a drain electrode are formed, a first protective film 237 is made of the same material to cover inside of the groove-shaped opening 227 and an end face of the interlayer insulating film removed portion 228 on the periphery of the substrate.

Subsequently, a second interlayer insulating film 238 is formed over an entire surface of the substrate. The second interlayer insulating film 238 can be made of the same material as the first interlayer insulating film 225. In this embodiment, the second interlayer insulating film 238 is made of the same siloxane film as the first interlayer insulating film.

Thereafter, a contact hole 239, a groove-shaped opening 240, and an interlayer insulating film removed portion 241 on the periphery of the substrate, which are to be connected to a pixel electrode, are formed under the same condition as that in etching the first interlayer insulating film.

In this embodiment, both the first interlayer insulating film 225 and the second interlayer insulating film 238 are made of a siloxane film; however, a structure of the interlayer insulating film is not limited thereto. The structure can appropriately be changed to a combination of an organic film for the first interlayer insulating film and an inorganic film for the second interlayer insulating film, the opposite combination thereof, a combination of an organic film and an organic film, a combination of an inorganic film and an inorganic film, or the like. A protective film may be formed only over either the first interlayer insulating film or the second interlayer insulating film depending on permeability of a selected interlayer film.

After a contact hole is formed in the second interlayer insulating film 238, a first electrode serving as an anode of a light emitting element is continuously formed in the contact hole 239 connected to the pixel electrode and over the second interlayer insulating film 238. An electrode of the light emitting element is a laminate of Al-Si(260a)/TiN(260b)/ITSO(260c). Here, Al-Si is aluminum containing silicon of approximately from 1 atomic % to 5 atomic %, and ITSO is a material in which ITO is mixed with $SiO_2$.

At the same time that the anode of the light emitting element is formed, inside of the groove-shaped opening 240 and the end face of the interlayer insulating film 238 at the interlayer insulating film removed portion 241 on the periphery of the substrate is covered with a protective film 242. The protective film may be formed with the electrodes 260a to 260c of the light emitting element. All of the three layers 260a to 260c may be used, or one or two of the layers may be used.

Subsequently, an insulator 243 is formed to cover an end face of the first electrode. The insulator 243 can be made of an inorganic or organic material. Silicon oxide, silicon oxynitride, siloxane, acrylic, polyimide, or the like can be given. It is preferable to form the insulator 243 by using a photosensitive organic material, since a shape of the opening becomes such a shape that a radius of curvature continuously changes and disconnection between the steps or the like hardly occurs when evaporating a light emitting layer.

Then, evaporation is performed with an evaporation source moving by using an evaporation apparatus. For example, evaporation is performed in a film formation chamber which is vacuum evacuated to 5×10$^{-3}$ Torr (0.665 Pa) or less, preferably to from 10$^{-4}$ Torr to 10$^{-6}$ Torr. When evaporation is performed, an organic compound is previously vaporized by resistance heating and flies in a direction of the substrate when a shutter is opened in evaporation. The vaporized organic compound flies upwardly and is evaporated to the substrate through an opening provided for a metal mask to form a light emitting layer 244 (including a hole transport layer, a hole injection layer, an electron transport layer, and an electron injection layer).

In this embodiment, the light emitting layer is formed by evaporation; therefore, a low molecular weight light-emitting material is used. However, the light emitting layer is formed also by using a high molecular weight material and an intermediate molecular weight material having characteristics between a low molecular weight material and a high molecular weight material. A high molecular weight material can be applied using spin coating or ink jetting by dissolving into a solvent. In addition, a composite material with an inorganic material as well as an organic material can also be used.

It is assumed that a light emitting mechanism of a light emitting element emits light in such a way that an electron injected from a cathode and a hole injected from an anode foam a molecular exciton by recombining at the center of light emission in an organic compound layer when voltage is applied to the organic compound layer interposed between a pair of electrodes, and energy for light emission is released when the molecular exciton turns back to the ground state. The excited state is known to include a singlet excited state and a triplet excited state, through either of which light can be emitted.

A light emitting layer typically has a laminated structure. The typical laminated structure is constituted as "a hole transport layer, an electroluminescent layer, and an electron transport layer." This structure has such a high luminous efficiency that light emitting devices that are recently researched and developed mostly employ this structure. A structure in which a hole injection layer, a hole transport layer, an electroluminescent layer, and an electron transport layer are laminated over the anode in this order, or a structure in which a hole injection layer, a hole transport layer, an electroluminescent layer, an electron transport layer, and an electron injection layer are laminated over the anode in this order may be employed as well. A fluorescent pigment or the like may be doped into the electroluminescent layer.

Subsequently, a second electrode 245 is formed as a cathode over the light emitting layer. The second electrode 245 may be made of a thin film containing a metal with a low work function (Li, Mg, or Cs). In addition, it is preferable that the second electrode is made of a laminated film in which a transparent conductive film (ITO (indium tin oxide), indium zinc oxide (In$_2$—O$_3$—ZnO), zinc oxide (ZnO), or the like) is laminated over the thin film containing Li, Mg, Cs, or the like. Further, the second electrode may be formed to be from 0.01 μm to 1 μm in thickness by electron beam evaporation, although the film thickness may be determined appropriately to serve as a cathode.

Such a light emitting element enables both monochrome display and multicolor display by selection and arrangement of the light emitting layer. For monochrome display, all light emitting elements are manufactured by using one material; however, there are several methods for multicolor display.

One is a separately coloring method. The separately coloring method realize multicolor display by separately coloring a light emitting layer which emits light of an objective color in a necessary portion. Another method is a color conversion method. Light emitting layers are made of one material, and a color conversion layer is provided only in a necessary portion. Light emitted from the light emitting layer is converted into a desired color through the color conversion layer, thereby realizing multicolor display. Another method is a method for providing a color filter for a white light emitting element. This method realizes multicolor display by forming a light emitting layer which emits white light all over the pixel portion and by passing through a color filter. In all of the methods, the light emitting layer is formed so that three primary colors of light of RGB are provided every pixel in the case of full color display. Thus, the light emitting device can perform monochrome, multicolor, and full color display.

An opposing substrate 248 is fixed to the substrate with a sealant 247 made of an impermeable material for sealing after a light emitting element 246 is completed in this way. The sealant 247 made of an impermeable material further firmly blocks off a water entrance and entry path when formed to cover an end face of an interlayer insulating film covered with a protective film in the groove-shaped openings 227 and 240 around an insulating film provided with a protective film and in the interlayer insulating film removed portions 228 and 241 on the periphery of the substrate, which greatly contributes to improvement in reliability. An impermeable ultraviolet curable resin may be used as the sealant 247 made of an impermeable material.

According to the above described steps, an electroluminescent device resistant to deterioration due to water entered from exterior can be manufactured, and reliability of the electroluminescent device can drastically be improved. Note that only one groove-shaped opening around an interlayer insulating film in a sealing portion is provided in this embodiment; however, a plurality of openings can be provided. Reliability is further improved by providing a plurality of openings.

[Embodiment 2]

Figure 17:
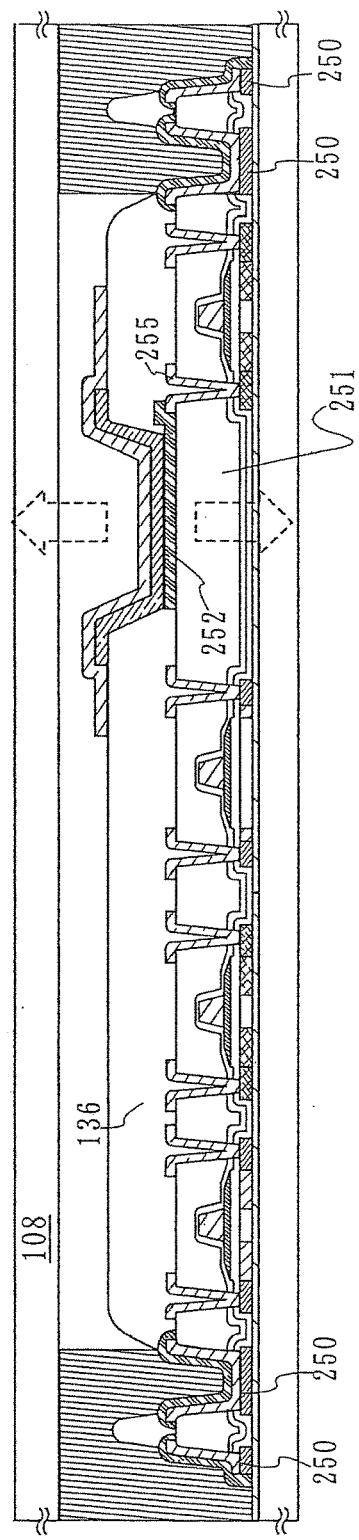
FIG. 17 shows Embodiment 2.

In this embodiment, an embodiment regarding Embodiment Mode 5 and Embodiment Mode 6 is described with reference to FIGS. 17 and 18A to 18I. In FIG. 17, an interlayer insulating film has a single layer structure; however, it may be regarded as having the same structure as in Embodiment 1. A structure of a first electrode in a light emitting element is different, but it is described below.

FIG. 17 is a cross-sectional view taken along a line f-f' in FIG. 3. In FIG. 17, an etching stopper film 250 is formed in a groove-shaped opening on the periphery of an interlayer insulating film and in an interlayer insulating film removed portion on the periphery of a substrate. The etching stopper film 250 can be formed at the same time as formation of a semiconductor layer of a transistor in a driver circuit portion or a pixel portion. It functions as an etching stopper in etching an interlayer insulating film 251 and has effect of improving adhesiveness of a sealant made of an impermeable material by reducing generation of an etching residue or unevenness.

Since it is similar to Embodiment 1 up to manufacturing a source electrode and a drain electrode except to have the etching stopper film 250, explanation is omitted. After a source electrode and a drain electrode are formed, a first electrode 252 of a light emitting element is formed to be in contact with an electrode 255 of a switching TFT in a pixel portion. In this embodiment, the first electrode 252 of the light emitting element is manufactured over an interlayer insulating film provided with the source electrode and the drain electrode. Therefore, it is not necessary to manufacture a second interlayer insulating film. A material similar to the first electrode in Embodiment 1 can be used as a material for the first electrode 252 or the like, and a process after manufacturing the first electrode is similar to Embodiment 1; therefore, explanation is omitted.

Here, light can be extracted in a direction of a substrate 200 when the first electrode is made of a transparent conductive film typified by ITO. In addition, light can be extracted in both directions of the substrate 200 and an opposing substrate 248 when a second electrode is also similarly made of a transparent material.

FIGS. 18A to 18I show a method for manufacturing a region "c" in FIG. 3. FIGS. 18A to 18E are cross-sectional views taken along a line a-a' in FIG. 3, and FIGS. 18F to 18I are top views of the region "c" in FIG. 3. FIGS. 18A to 18E and FIGS. 18F to 18I adjacent to each other respectively show a diagram of the same step. In FIGS. 18A to 18I, a left side is a direction of an FPC and a right side is a direction of a display portion. Since FIGS. 18F to 18I have a direction different from that in the region "c" in FIG. 3, it is necessary to be paid attention to.

Figure 18A:
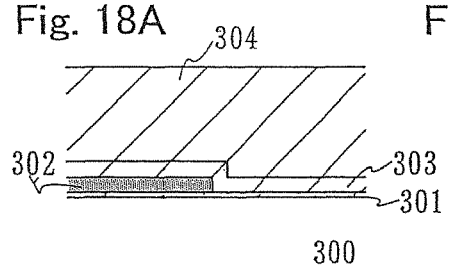
FIGS. 18A to 18I show Embodiment 2.
Figure 18F:
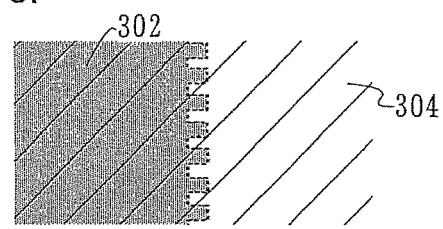

When a transistor and a first insulating film are formed in a display portion in this embodiment, a base insulating film 301 is formed over a substrate 300 in a wiring portion connecting an external terminal and an internal circuit. An etching stopper film 302 (silicon film) is formed in a portion from which an interlayer film is removed over the base insulating film 301; an insulating film 303 functioning as a gate insulating film is formed to cover the etching stopper film 302 (silicon film) and the base insulating film 301; and then, a first interlayer insulating film 304 is formed to cover the same. An acrylic film or a siloxane film can be employed for the first interlayer film; however, a siloxane film is used in this embodiment (FIGS. 18A and 18F).

Figure 18B:
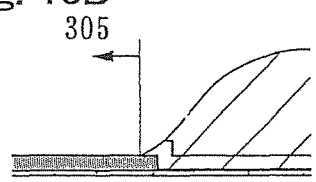
Figure 18G:
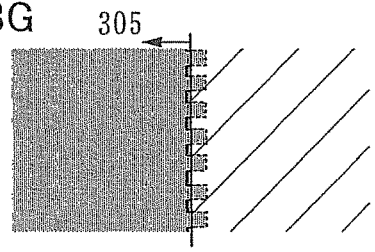

Thereafter, the first interlayer insulating film 304 is etched and removed to have a tapered shape on an end face thereof, thereby forming an interlayer insulating film removed portion 305 on the periphery of the substrate. The etching stopper film 302 (silicon film) serving as an etching stopper is formed in advance in the interlayer insulating film removed portion 305. Therefore, a surface of the interlayer insulating film removed portion 305 after removal is even, and unevenness due to an etching residue or gouge of a base film is not caused. (FIGS. 18B and 18G)

Figure 18C:
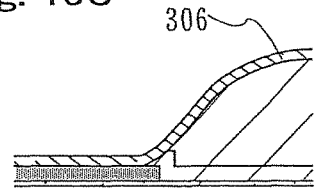
Figure 18H:
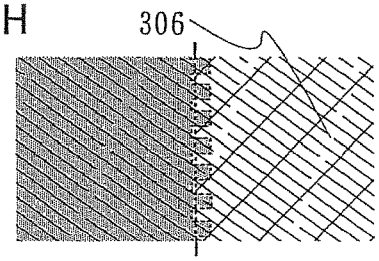

Subsequently, a metal film 306 serving as a wiring is formed. The metal film may be made of the same material as the source electrode and the drain electrode in the driver circuit portion or the pixel portion. A specific material is similar to the material for the source electrode and the drain electrode in Embodiment 1 (FIGS. 18C and 18H).

Figure 18D:
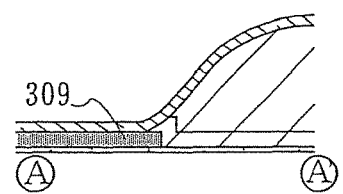
Figure 18E:
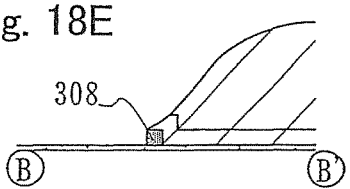
Figure 18I:
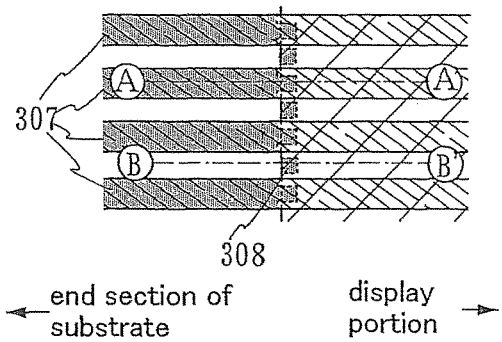

The metal film 306 is etched simultaneously with etching for forming the source electrode and the drain electrode in order to form a wiring 307. At this time, a portion without being covered with the wiring 307 of the etching stopper film 302 (silicon film) formed in the interlayer insulating film removed portion 305 is removed by the etching. When an etching stopper film 302 which is not located below the wiring 307 and is formed in a position 308 below a remaining interlayer insulating film 304 is previously formed in such a shape that it is separated from the etching stopper film 309 (silicon film) located below the wiring 307 after wiring etching, wirings adjacent to each other do not short-circuit, even if the etching stopper film 302 is made of a conductive material (FIGS. 18D, 18E, and 18I).

Generation of unevenness in the interlayer insulating film removed portion 305 can be prevented and generation of large unevenness on a wiring to be formed thereafter can also be suppressed by foaming the etching stopper film 302 (silicon film) as an etching stopper. Adhesiveness of a sealant made of an impermeable material to be formed thereover can be maintained, and water entering from a portion having poor adhesiveness of a sealant can be reduced.

When such a structure is employed, an interlayer insulating film can be removed also in a wiring portion connecting an external terminal portion (such as an FPC) and an internal circuit, and the interlayer insulating film can be prevented from being exposed to outer air. Consequently, water entry can drastically be reduced, which contributes to improvement in reliability of an electroluminescent device.

After removing the first interlayer insulating film on the periphery of the substrate to have a tapered shape on its end face and before forming metal for a wiring, it is useful to form a nitride film such as a silicon nitride film or a carbon nitride film thereover by CVD in order to prevent moisture from entering from an end face (not shown). Higher reliability can be obtained by forming such a nitride film.

In this embodiment, the first interlayer insulating film on the periphery of the substrate is removed by the same step as opening of a contact hole in a pixel portion and a driver circuit portion. Therefore, in the pixel portion and a driver circuit portion, conduction between a wiring in a lower layer or the like and a wiring formed over the first interlayer insulating film, which is to be performed through the contact hole, may not be made, when the nitride film is formed after removing the first interlayer insulating film. Thus, in a portion which is required to electrically be in contact with a lower portion, a nitride film in the portion is preferably removed before forming metal for a wiring. When a nitride film is formed over the first interlayer insulating film, moisture can be prevented from entering from an end face of an interlayer insulating film in such a contact hole portion. Consequently, further higher reliability can be obtained.

[Embodiment 3]

In this embodiment, an example of a pixel structure in an electroluminescent device to which a structure of the present invention is applied is described with reference to FIGS. 19A and 19B.

Figure 19A:
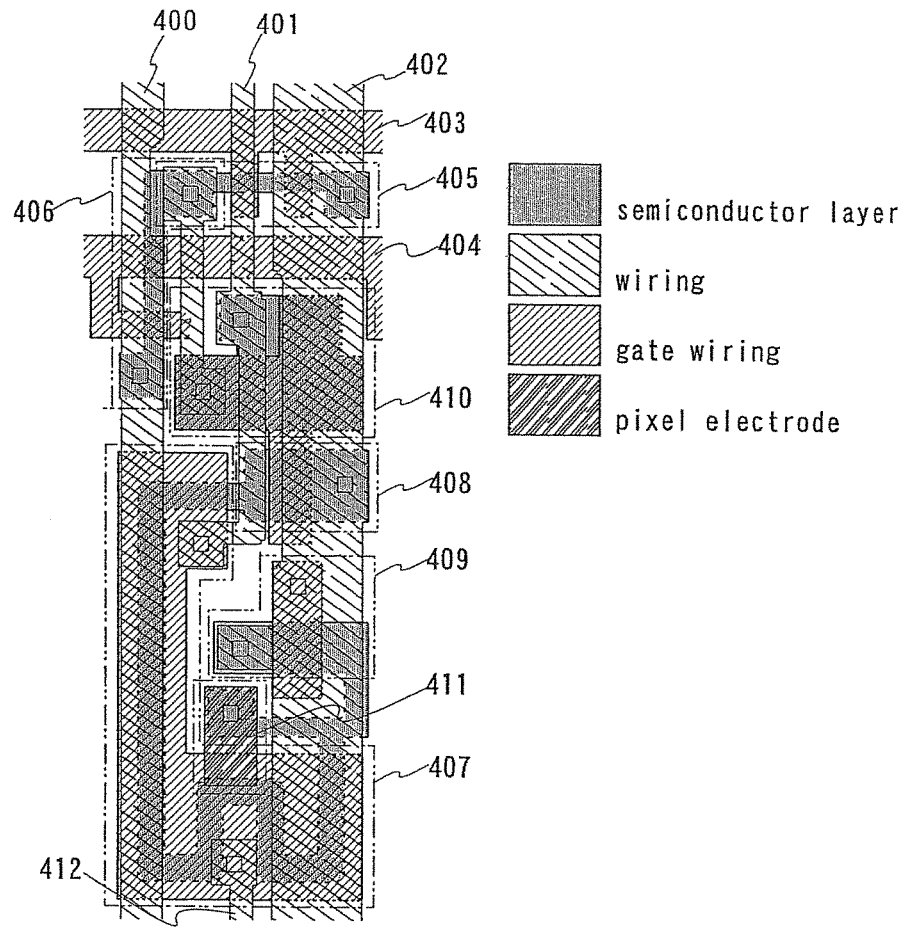
FIGS. 19A and 19B show Embodiment 3.
Figure 19B:
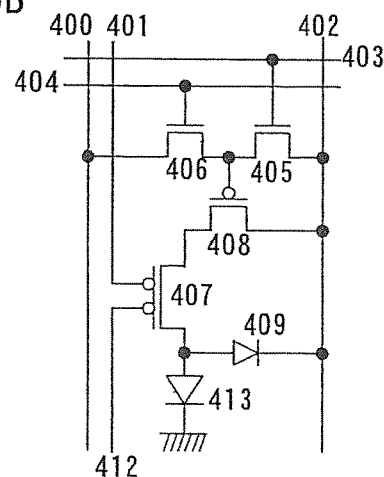

FIGS. 19A and 19B show an element structure of one pixel. The display portion in FIG. 3 is formed by arranging a plurality of such pixels in matrix. Naturally, this pixel structure is merely an example, and any other conceivable pixel structures may be employed.

In FIGS. 19A and 19B, a top emission structure is adopted. One pixel includes a source line 400, a driver TFT gate line 401, an anode line 402, an erasing gate line 403, a writing gate line 404, an erasing TFT 405, a writing TFT 406, a driver TFT 407, a display TFT 408, an AC driving diode 409, a capacitor 410, a drain electrode 411 of a driver TFT, and a driver TFT gate line 412.

Then, a light emitting element 413 is formed in an upper portion thereof through an insulating film, and an anode or a cathode of a light emitting element is connected to the drain electrode 411 of a driver TFT.

[Embodiment 4]

Figure 20:
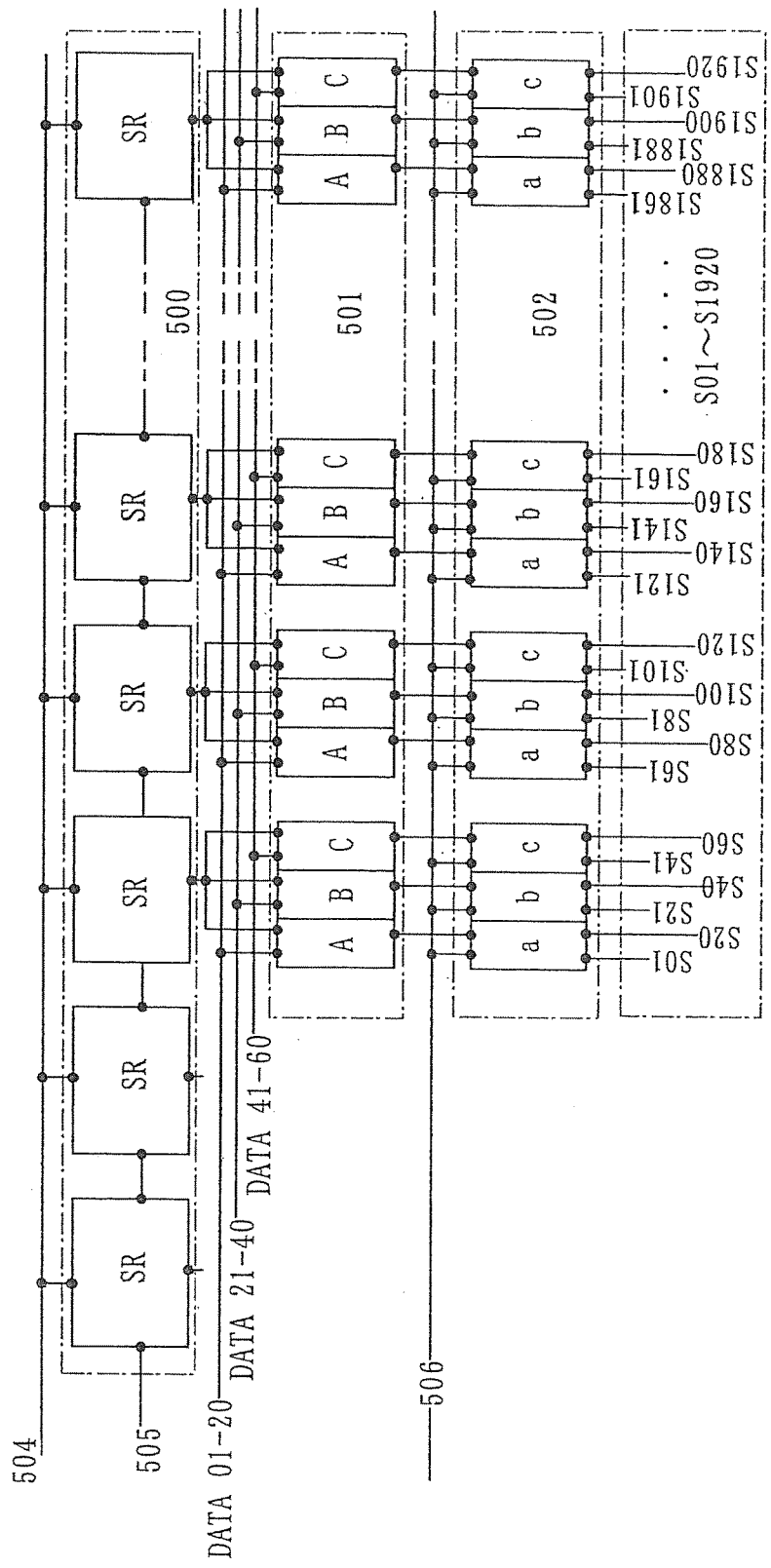
FIG. 20 shows Embodiment 4.

In this embodiment, a structure of a source driver that is required to display an image in an electroluminescent device is described with reference to FIG. 20.

In a row where a gate signal line is selected, a shift register 500 (SR) outputs a sampling pulse sequentially from a first stage in accordance with a clock pulse 504 and a start pulse 505. A first latch circuit 501 takes in a video signal in timing with a sampling pulse being inputted, and the video signal taken in at each stage is stored in the first latch circuit 501.

According to a sampling pulse outputted from one shift register 500, three latch circuits A, B, and C in the first latch circuit 501 take in signals inputted from video lines DATA 01 to 20, DATA 21 to 40, DATA 41 to 60, respectively. A sampling pulse outputted from the shift register 500 in the first stage takes in a video signal for being charged and discharged in a source signal line from S01 to S60 among source signal lines from S01 to S1920. In the first latch circuit that takes in a video signal in response to a sampling pulse of the shift register 500 in the first stage, the latch circuit A stores a video signal for source signal lines from S01 to S20; B, from S21 to S40; and C, from S41 to S60. Subsequently, the first latch circuit that takes in a video signal in response to a sampling pulse outputted from the shift register in the second stage takes in a video signal for source signal lines from S61 to S120. The latch circuits A, B, and C store a video signal for source signal lines from S61 to S80, from S81 to S100, and from S101 to S120, respectively. Similarly, a shift register in the 32nd stage takes in and stores a video signal for source signal lines from S1861 to S1920; then, taking in a video signal for one row is completed.

When a latch pulse (LAT) 506 is outputted after taking in a video signal for one row is completed, the video signal stored in the first latch circuit 501 is transferred to a second latch circuit 502 all at once, and all signal lines are charged and discharged all at once. A level shifter and a buffer for making output from the second latch circuit 502 a desired size may appropriately be provided as necessary.

The above-mentioned operation is repeated from the first row to the last row, thereby completing writing for one frame. Thereafter, similar operations are repeated to display an image.

Note that a source driver having this structure is merely an example, and the present invention can be applied even if any other structures of a source driver are employed.

[Embodiment 5]

A method for forming an end face of an insulating film into a tapered shape as described in Embodiment Mode 5 is described in this embodiment.

When isotropic etching such as wet etching can be performed and there are a margin in etching and a certain film thickness, a tapered shape can easily be obtained.

A method for forming an insulating film into a tapered shape by anisotropic dry etching is described in this embodiment.

First, a method for processing an object into a desired shape by dry etching using an etching mask previously manufactured by a conventional method is described with reference to FIGS. 21A to 21E.

Figure 21A:
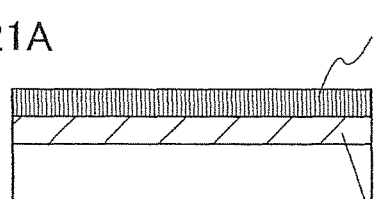
FIGS. 21A to 21J show Embodiment 5.
Figure 21F:
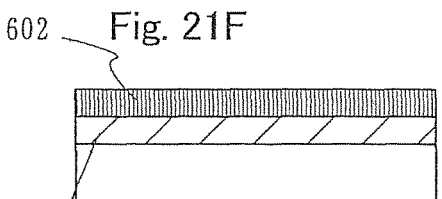

A mask material 602 such as a photosensitive resist or polyimide is formed over an entire surface of an object to be processed 601 by application or the like (FIG. 21A). A positive resist is given as an example in this description.

Figure 21B:
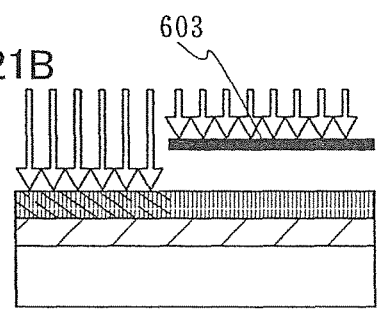
Figure 21G:
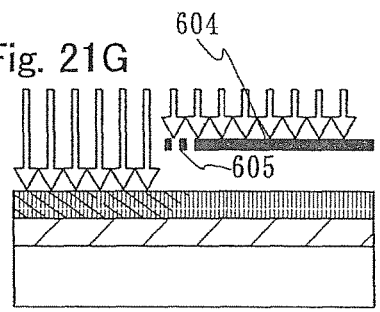
Figure 21C:
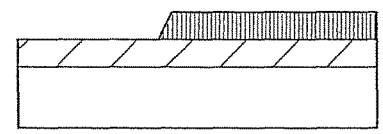
Figure 21H:
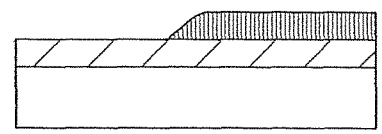

Subsequently, pre-bake at low temperature for vaporizing and stabilizing a material in the resist is performed; thereafter, the resist is partially exposed to light through a photomask 603 in a desired shape (FIG. 21B).

After a portion exposed to light by the light-exposure is dissolved in developer and is removed (FIG. 21C), baking is performed to improve adhesiveness of the resist and to improve resistance to an etchant to be used in the next step. An etching mask for an object is formed so far. The step so far is referred to as photolithography.

Figure 21D:
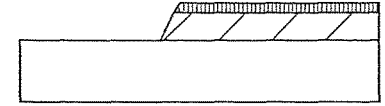
Figure 21I:
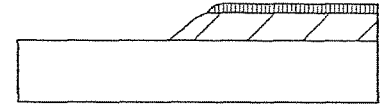
Figure 21E:
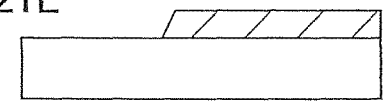
Figure 21J:
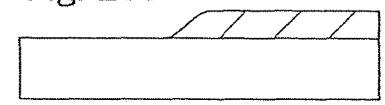

An object can be processed into a desired shape by etching the object using the mask and an appropriate etchant (FIG. 21D).

Here, the end face of the etching mask is at large angle to the object located in a lower portion. Therefore, the end face of the object which is located in a lower portion becomes steep reflecting the shape of the end face of the etching mask, when anisotropic etching such as dry etching is performed. When an interlayer insulating film on the periphery of the substrate is removed and a wiring is formed in such a way, an etching residue of a wiring as described in Embodiment Mode 4 or 5 is generated on an end face of the interlayer insulating film, which causes a defect due to wiring short circuit.

Consequently, in forming a mask by photolithography, a slit 605 having narrower width than limit of resolution of a photolithography apparatus used for light-exposure is formed on an end face of a portion of the photomask 604 which is preferably formed into a tapered shape. A mask material such as a resist which is exposed to light through a slit and a pattern having narrower width than resolution of a photolithography apparatus is not completely exposed to light in the portion. A mask of which film thickness is decreased remains even after removing a light-exposed portion with developer.

An incomplete light-exposed portion as described above is provided between a non-light-exposed portion and a complete light-exposed portion in a photosensitive mask material such as a resist by thus forming a slit or a hole having width equal to or narrower than light-exposure resolution of a photolithography apparatus in a photomask. Accordingly, an end face of an etching mask can be formed into a tapered shape.

When anisotropic etching typified by dry etching is performed using the etching mask having a tapered shape under such a condition that both the object in a lower layer and the mask are etched, the etching mask disappears where thickness thereof is thin at the same time that the object is etched. According to disappearance of the etching mask, an object newly exposed to etching atmosphere is sequentially etched, thereby obtaining an object having a shape nearly reflecting a shape of the etching mask (FIGS. 21F to 21J).

An object (an interlayer insulating film in Embodiment Mode 5) having a similar tapered shape on an end face thereof is obtained by using the etching mask having a tapered shape on an end face thereof.

Figure 22A:
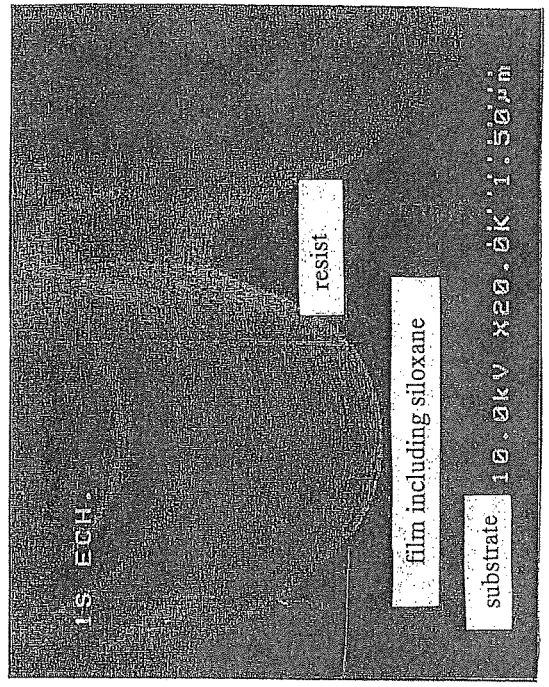
FIGS. 22A to 22D are SEM pictures and pattern diagrams showing Embodiment 5.
Figure 22B:
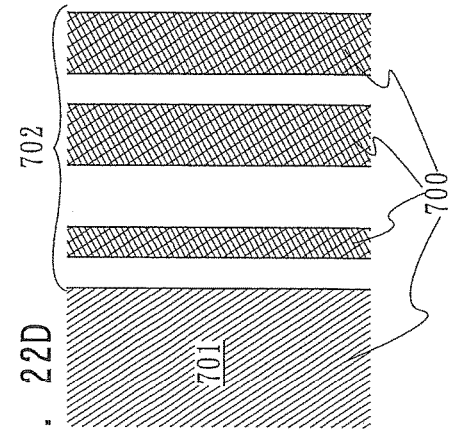
Figure 22C:
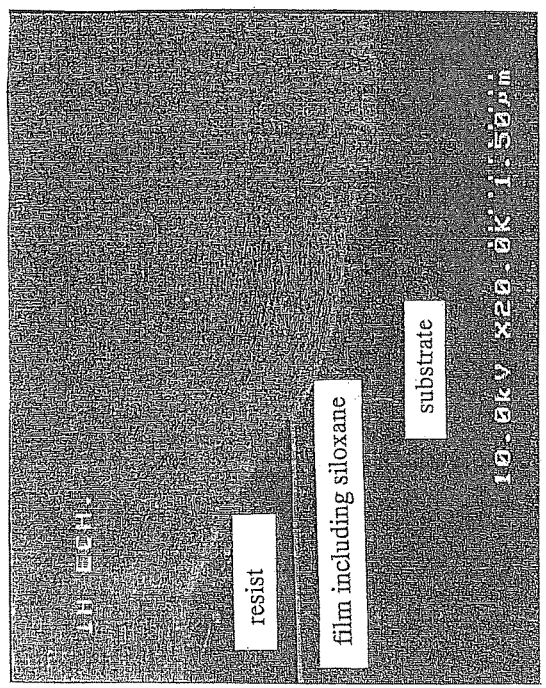
Figure 22D:
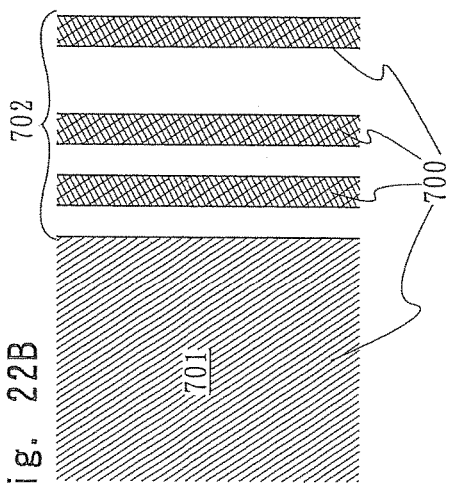

A shape of a photosensitive material after development can freely be formed depending on shapes of a slit, a pattern, and a hole of a photomask in exposing to light. FIGS. 22A to 22D show an example thereof. FIGS. 22A and 22C are SEM pictures of a sample in which a siloxane film is formed over a substrate, a resist is applied thereover, exposed to light with a photomask 700, and etched by dry etching, and FIGS. 22B and 22D are schematic diagrams of a photomask. The SEM pictures show that a resist is exposed to light with a photomask having such a pattern as the photomask 700 shown in FIG. 22B or 22D.

While only a portion 701 is exposed to light with a typical photomask, a cross-sectional shape as shown in the SEM picture can be obtained in FIGS. 22A to 22D by forming a pattern 702 equal to or narrower than limit of resolution of a photolithography apparatus in a photomask.

As shown in FIGS. 22A to 22D, an object can have various shapes by changing a shape of the pattern 702 equal to or narrower than limit of resolution of a photolithography apparatus. An object having a shape that cannot be formed ever before can be manufactured by appropriately changing an object material and an etching condition using the thus formed etching mask.

[Embodiment 6]

Examples of electronic devices to which the present invention is applied can be given as a video camera, a digital camera, a goggle type display (head mounted display), a navigation system, an audio reproducing device (car audio, an audio component, or the like), a laptop personal computer, a game machine, a personal digital assistant (a mobile computer, a cellular phone, a portable game machine, an electronic book, or the like), and an image reproducing device including a recording medium (specifically, a device capable of processing data in a recording medium such as a Digital Versatile Disk (DVD) and having a display that can display the image of the data). Practical examples of these electronic devices are shown in FIGS. 23A to 23E.

Figure 23A:
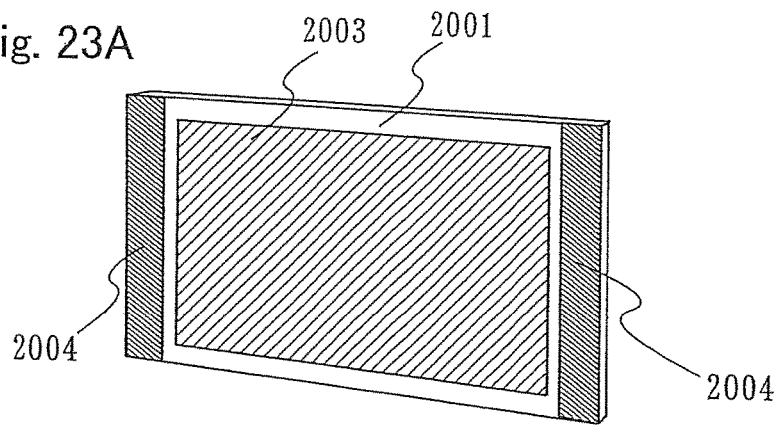
FIGS. 23A to 23 E show examples of electronic devices.

FIG. 23A shows a wall-mounted display device, which includes a chassis 2001, a display portion 2003, a speaker portion 2004, and the like. The present invention is applied to manufacturing of the display portion 2003. Longer-term reliability can be secured by employing the present invention.

Figure 23B:
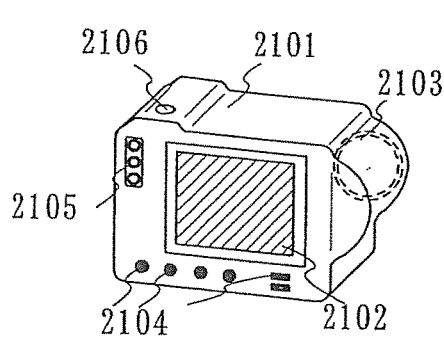

FIG. 23B shows a digital still camera, which includes a main body 2101, a display portion 2102, an image receiving portion 2103, operation keys 2104, an external connection port 2105, a shutter 2106, and the like. The present invention can be applied to the display portion 2102. Although a digital still camera is often used outside and tends to be put in a harder condition than indoors, long-term reliability can be obtained even under a comparatively hard condition by employing the present invention.

Figure 23C:
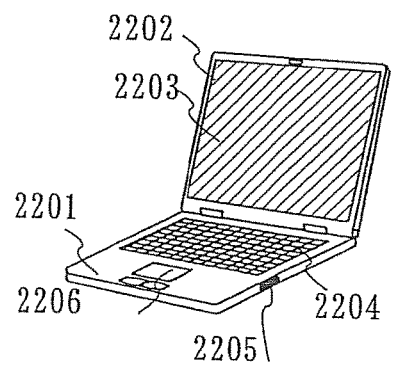

FIG. 23C shows a laptop personal computer, which includes a main body 2201, a chassis 2202, a display portion 2203, a keyboard 2204, an external connection port 2205, a pointing mouse 2206, and the like. The present invention can be applied to the display portion 2203. A laptop personal computer can conceivably be carried around and used, which is different from a desktop computer. Similarly as a digital still camera, possibility of use under a more adverse condition than a monitor of a desktop computer increases by being carried around. Longer-term reliability can be secured even under such a condition by employing the present invention.

Figure 23D:
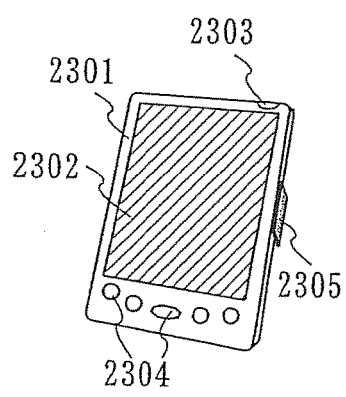

FIG. 23D shows a mobile computer, which includes a main body 2301, a display portion 2302, a switch 2303, operation keys 2304, an infrared port 2305, and the like. The present invention can be applied to the display portion 2302. Although a mobile computer is often used outside and tends to be put in a harder condition than indoors, long-term reliability can be obtained even under a comparatively hard condition by employing the present invention.

Figure 23E:
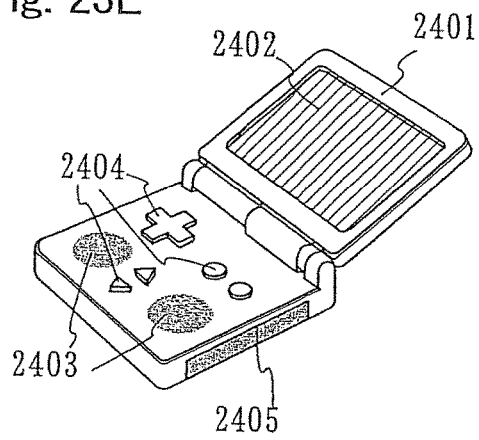

FIG. 23E shows a portable game machine, which includes a chassis 2401, a display portion 2402, a speaker portion 2403, operation keys 2404, a recording medium insertion portion 2405, and the like. The present invention can be applied to the display portion 2402. Although a portable game machine is often used outside and tends to be put in a harder condition than indoors, long-term reliability can be obtained even under a comparatively hard condition by employing the present invention.

As described above, the applicable range of the present invention is so wide that the invention can be applied to electronic devices of various fields. In addition, reliability of a product improves, so that reliability as a manufacturer can also be improved.

This application is based on Japanese Patent Application serial no. 2003-347601 filed in Japan Patent Office on Aug. 29 in 2003 and no. 2003-322334 filed on Sept. 12 in 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A light emitting device comprising:
a first film;
a first insulating layer over the first film;
a semiconductor layer over the first insulating layer;
a second insulating layer over the first insulating layer;
a gate electrode;
an interlayer insulating layer over the gate electrode and the second insulating layer;
an organic film over the interlayer insulating layer;
a light emitting element over the interlayer insulating layer, the light emitting element being electrically connected to the semiconductor layer; and
a sealant over the organic film,
wherein the gate electrode and the semiconductor layer overlap with each other with the second insulating layer provided therebetween,
wherein the sealant is in direct contact with a top surface of the organic film and an outermost side surface of the organic film, and
wherein the sealant is in direct contact with an upper surface of the first insulating layer in a region between an edge of the first film and the outermost side surface of the organic film.

2. The light emitting device according to claim 1, wherein the first film comprises carbon.

3. The light emitting device according to claim 1, wherein an edge of the sealant is aligned with the edge of the first film.

4. The light emitting device according to claim 1, wherein the semiconductor layer comprises poly-silicon.

5. The light emitting device according to claim 1, further comprising a second film over the organic film,
wherein the second film faces the first film, and
wherein the sealant is in direct contact with the second film.

6. The light emitting device according to claim 1, wherein the sealant comprises a first region whose level is lower than a level of a second region of the organic film.

7. A light emitting device comprising:
a plastic substrate;
a first insulating layer over the plastic substrate;
a semiconductor layer over the first insulating layer;
a second insulating layer over the first insulating layer;
a gate electrode;
an interlayer insulating layer over the gate electrode and the second insulating layer;
an organic film over the interlayer insulating layer;
a light emitting element over the interlayer insulating layer, the light emitting element being electrically connected to the semiconductor layer; and
a sealant over the organic film,
wherein the gate electrode and the semiconductor layer overlap with each other with the second insulating layer provided therebetween, wherein the sealant is in direct contact with a top surface of the organic film and an outermost side surface of the organic film, and wherein the sealant is in direct contact with an upper surface of the first insulating layer in a region between an edge of the plastic substrate and the outermost side surface of the organic film.

8. The light emitting device according to claim 7, wherein an edge of the sealant is aligned with the edge of the plastic substrate.

9. The light emitting device according to claim 7, wherein the semiconductor layer comprises poly-silicon.

10. The light emitting device according to claim 7, further comprising a second film over the organic film, wherein the second film faces the plastic substrate, wherein the sealant is in direct contact with the second film.

11. The light emitting device according to claim 7, wherein the sealant comprises a first region whose level is lower than a level of a second region of the organic film.

12. The light emitting device according to claim 1, wherein the gate electrode is over the second insulating layer.

13. The light emitting device according to claim 7, wherein the gate electrode is over the second insulating layer.

* * * * *